(12) United States Patent
Werking

(10) Patent No.: US 10,840,907 B1
(45) Date of Patent: Nov. 17, 2020

(54) SOURCE-COUPLED LOGIC WITH REFERENCE CONTROLLED INPUTS

(71) Applicant: Honeywell International Inc., Morris Plains, NJ (US)

(72) Inventor: Paul M. Werking, Rockford, MN (US)

(73) Assignee: Honeywell International Inc., Charlotte, NC (US)

(*) Notice: Subject to any disclaimer, the term of this patent is extended or adjusted under 35 U.S.C. 154(b) by 0 days.

(21) Appl. No.: 16/688,829

(22) Filed: Nov. 19, 2019

(51) Int. Cl.
*H03K 19/003* (2006.01)
*H03K 19/00* (2006.01)
*H03K 19/0185* (2006.01)

(52) U.S. Cl.
CPC ... *H03K 19/00361* (2013.01); *H03K 19/0013* (2013.01); *H03K 19/00315* (2013.01); *H03K 19/00384* (2013.01); *H03K 19/018521* (2013.01)

(58) Field of Classification Search
CPC ......... H03K 19/0013; H03K 19/00315; H03K 19/00361; H03K 19/00384; H03K 19/018521
USPC .............................. 326/86, 87, 119, 121, 122
See application file for complete search history.

(56) References Cited

U.S. PATENT DOCUMENTS

| | | |
|---|---|---|
| 4,686,392 A | 8/1987 | Lo |
| 4,808,851 A | 2/1989 | Chantepie |
| 4,833,347 A | 5/1989 | Rabe |
| 5,149,992 A | 9/1992 | Allstot et al. |
| 5,177,378 A | 1/1993 | Nagasawa |
| 5,508,635 A * | 4/1996 | Kwon ................... G11C 7/1051 326/27 |
| 5,604,448 A * | 2/1997 | Kim ................. H03K 19/00361 326/27 |
| 5,644,266 A | 7/1997 | Chen et al. |
| 5,798,658 A | 8/1998 | Werking |
| 5,977,796 A | 11/1999 | Gabara |
| 6,008,670 A | 12/1999 | Pace |
| 6,154,802 A | 11/2000 | Khosrowpour |
| 6,229,353 B1 * | 5/2001 | Werking ................. G05F 3/247 327/78 |

(Continued)

OTHER PUBLICATIONS

Assaderaghi et al., "Dynamic Threshold-Voltage MOSFET (DTMOS) for Ultra-Low Voltage VLSI," IEEE Transactions on Electron Devices, vol. 44, No. 3, Mar. 1997, 9 pp.

(Continued)

*Primary Examiner* — Daniel D Chang
(74) *Attorney, Agent, or Firm* — Shumaker & Sieffert, P.A.

(57) ABSTRACT

A source-coupled logic (SCL) gate configured to reduce power supply noise generation and reduce DC power consumption by adjusting a bias current to deliver only the performance level required for a given application. The SCL gate circuit arrangement includes a current mirror circuit with transistors configured as pull-up transistors. The pull-up transistors set the logical HIGH voltage level. The SCL gate circuit may also include voltage limiting devices configured to set the logical LOW voltage level. The current mirror circuit and the voltage limiting devices allow the SCL gate to receive a bias current supplied a bias circuit that is less complex than bias circuitry used by other examples of SCL circuitry. Adjusting the bias current delivers the desired performance with the commensurate reduction in power consumption.

20 Claims, 19 Drawing Sheets

(56) References Cited

U.S. PATENT DOCUMENTS

| | | |
|---|---|---|
| 6,284,616 B1 | 9/2001 | Smith |
| 6,308,231 B1 | 10/2001 | Galecki et al. |
| 6,320,422 B1 | 11/2001 | Koh |
| 6,369,606 B1 | 4/2002 | Houghton et al. |
| 6,552,577 B1 * | 4/2003 | Tam .................. H03K 19/0136 326/126 |
| 6,639,433 B1 | 10/2003 | Heckenbach |
| 6,693,463 B2 | 2/2004 | Mateman |
| 6,826,215 B2 | 11/2004 | Tsuji et al. |
| 6,900,670 B2 | 5/2005 | Hairapetian |
| 6,906,651 B2 | 6/2005 | Yang et al. |
| 6,909,309 B2 | 6/2005 | Green |
| 6,911,855 B2 | 6/2005 | Yin et al. |
| 6,937,080 B2 | 8/2005 | Hairapetian |
| 6,982,583 B2 | 1/2006 | Yin et al. |
| 7,010,763 B2 | 3/2006 | Hathaway et al. |
| 7,132,727 B2 | 11/2006 | Momtaz et al. |
| 7,215,169 B2 | 5/2007 | Hairapetian |
| 7,288,971 B1 | 10/2007 | Plasterer et al. |
| 7,403,037 B2 | 7/2008 | Haraguchi |
| 8,742,797 B2 * | 6/2014 | Hoskins ............... G11C 27/026 327/94 |

OTHER PUBLICATIONS

Keim, "MOSFET Channel-Length Modulation," accessed from https://www.allaboutcircuits.com/technical-articles/mosfet-channel-length-modulation/, Jul. 25, 2016, 4 pp.

Smith, "Lecture 29: Diode connected devices, mirrors, cascode connections," Department of EECS, accessed from https://inst.eecs.berkeley.edu/~ee105/sp04/handouts/lectures/, last modified Apr. 6, 2004, 15 pp.

Srivastava, "Dynamic Threshold MOS (DTMOS) and its Application," International Journal of Science, Engineering and Technology Research (IJSETR) vol. 5, Issue 6, Jun. 2016, 5 pp.

Werking, "An ECL and TTL Compatible Source-Coupled Logic Using Reference Controlled Inputs," Ohio State University, 1994, 86 pp. (Applicant points out, in accordance with MPEP 609.04(a), that the year of publication, 1994, is sufficiently earlier than the effective U.S. filing date, so that the particular month of publication is not in issue.)

* cited by examiner

US 10,840,907 B1

SOURCE-COUPLED LOGIC WITH REFERENCE CONTROLLED INPUTS

TECHNICAL FIELD

The disclosure relates to mixed mode integrated circuits.

BACKGROUND

Power supply noise generated by high-speed complementary metal-oxide-semiconductor (CMOS) logic can limit the performance of low noise precision analog circuits in mixed-mode integrated circuit (IC) designs. One example may include a mixed-mode (i.e. both digital and analog circuitry) application-specific integrated circuit (ASIC), which is an IC customized for a particular use, rather than intended for general-purpose use.

SUMMARY

In general, the disclosure is directed to an improved source-coupled logic (SCL) gate, which by adjusting a bias current to deliver only the performance level required for a given application, may reduce power supply noise generation and also reduce the DC power consumption when compared to other types of SCL circuits. The SCL gate circuit arrangement includes a current mirror circuit with transistors configured as pull-up transistors. The pull-up transistors set the logical HIGH voltage level. The SCL gate circuit may also include voltage limiting devices configured to set the logical LOW voltage level. The current mirror circuit and the voltage limiting devices allow the SCL gate to receive a bias current supplied a bias circuit that is less complex than bias circuitry used by other examples of SCL circuitry. Adjusting the bias current delivers the desired performance with the commensurate reduction in power consumption. The techniques of this disclosure may improve the speed-power product of the SCL gate by reducing both the gate delay and the gate power consumption.

In one example of this disclosure, a logic gate circuit includes a first input terminal configured to receive an input logic level; a second input terminal configured to receive a logic threshold level; a first output voltage terminal; a first dynamic threshold (DT) metal oxide semiconductor field effect transistor (MOSFET) configured to drive the first output voltage terminal and cause the first output voltage terminal to output a buffered logic level of the input logic level; a second output voltage terminal; a second DT MOSFET configured to drive the second output voltage terminal and cause the second output voltage terminal to output an inverted logic level of the input logic level; a pull-up transistor configured to operate in a saturation region of the pull-up transistor and set a first voltage magnitude representing a logic level one for the logic gate circuit; a voltage limiting element coupled to a supply voltage and configured to set a second voltage magnitude representing a logic level zero for the logic gate circuit, wherein: in response to an input logic level greater than the logic threshold level, output the first voltage magnitude at the first output voltage terminal; in response to an input logic level less than the logic threshold level, output the second voltage magnitude at the first output voltage terminal.

In another example of this disclosure, a system includes a bias circuit comprising: a first dynamic threshold (DT) metal oxide semiconductor field effect transistor (MOSFET) configured to drive a logic threshold level; a first voltage limiting element coupled to the gate of the third DT MOSFET; a current mirror circuit configured to receive a bias voltage, wherein a magnitude of current through the first DT MOSFET is based on the bias voltage; and a plurality of logic gate circuits, wherein each respective logic gate circuit is configured to receive from the bias circuit: the logic threshold level; and the bias voltage; and wherein each respective logic gate circuit comprises: a first input terminal configured to receive an input logic level; a first output voltage terminal; a second dynamic threshold (DT) metal oxide semiconductor field effect transistor (MOSFET) configured to drive the first output voltage terminal and cause the first output voltage terminal to output a buffered logic level of the input logic level; a second output voltage terminal; a third DT MOSFET configured to drive the second output voltage terminal and cause the second output voltage terminal to output an inverted logic level of the input logic level; a pull-up transistor configured to operate in a saturation region of the pull-up transistor and set a first voltage magnitude representing a logic level one for the logic gate circuit; a voltage limiting element coupled to a supply voltage and configured to set a second voltage magnitude representing a logic level zero for the logic gate circuit.

In another example of this disclosure, a method includes receiving, by a logic gate circuit, a bias input, wherein a magnitude of the bias input sets a performance level of the of logic gate circuit, and wherein the bias input is one of a bias voltage or a bias current; receiving, by the logic gate circuit, a logic threshold level; receiving, by the logic gate circuit an input logic level; in response to the input logic level being less than the logic threshold level, outputting, by a dynamic threshold (DT) metal oxide semiconductor field effect transistor (MOSFET) of the logic gate circuit, a first voltage magnitude representing a logic level zero; in response to the input logic level being greater than the logic threshold level, outputting, by the DT MOSFET of the logic gate circuit, a second voltage magnitude representing a logic level one, wherein: a pull-up transistor (M5 or M6) is coupled to a gate of the DT MOSFET, and wherein the pull-up transistor configured to set the first voltage magnitude representing the logic level one and configured to operate in a saturation region of the pull-up transistor, and a voltage limiting element (M13 or M14) is coupled between a supply voltage and the gate of the DT MOSFET, wherein the voltage limiting element is configured to set the second voltage magnitude representing the logic level zero.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure is directed to an improved source-coupled logic (SCL) gate configured to reduce power supply noise generation and also reduce the DC power consumption when compared to other types of SCL circuits. The techniques of this disclosure may improve the speed-power product of the SCL gate by reducing both the gate delay and the gate power consumption.

On mixed-mode integrated circuits (IC), SCL may have advantages over CMOS logic because CMOS logic may introduce large current spikes on the power supply bus when switching. Current spikes on the power supply bus may interfere with the function of some analog circuitry on the mixed-mode IC. However, SCL may consume significantly more power than CMOS logic. The techniques of this disclosure describe SCL circuits that may the reduce the SCL performance, and consequently the amount of power consumed by the SCL blocks on the IC. In some examples of mixed-mode applications the performance of the SCL circuitry may be orders-of-magnitude greater than what is required. The performance of SCL circuitry of this disclosure may be reduced to only the level required for a given application, with the commensurate reduction in power consumption. The SCL circuitry of this disclosure also uses an improved bias circuit that is less complex than bias circuitry used by other examples of SCL circuitry. The improvements to the SCL circuitry of this disclosure also result in a gate delay and gate power consumption with a resulting improved speed-power product when compared to other SCL techniques.

Figure 1:
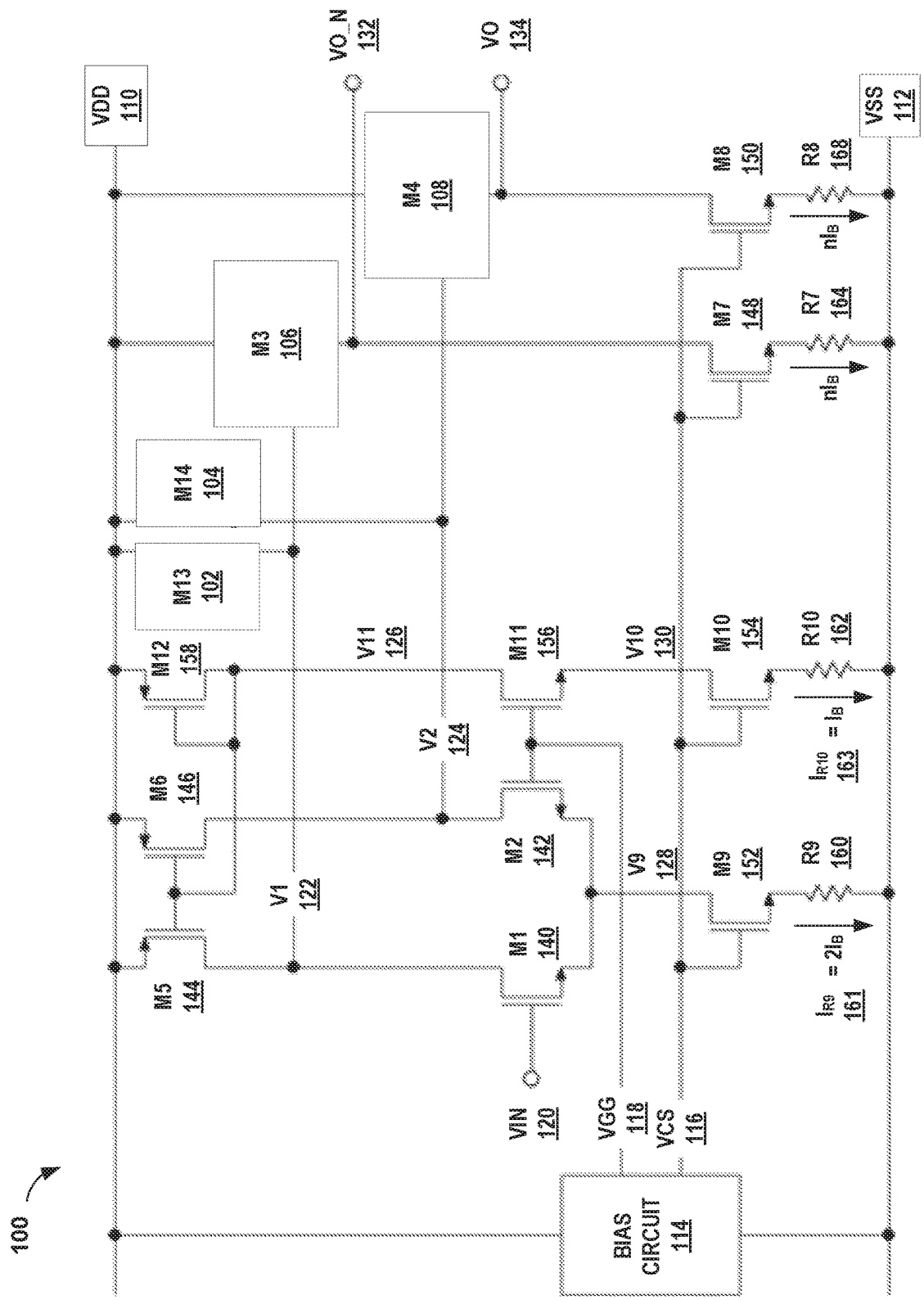
FIG. 1 is a schematic diagram illustrating an example implementation of a source-coupled logic (SCL) gate of this disclosure.

FIG. 1 is a schematic diagram illustrating an example implementation of a source-coupled logic (SCL) gate of this disclosure. Circuit 100 depicts a buffer-inverter implemented by SCL, which may be applied to a variety of mixed-mode and other applications. The techniques of this disclosure may be applied to other types of SCL circuits such as flip-flops, OR gates, AND gates, XOR gates, multiplexers, latches, counters, and other complex logic functions, which are built from a combination of logic gates. The techniques of this disclosure are not limited to just a buffer-inverter circuit. Examples techniques to implement other logic functions may be found, for example, in U.S. Pat. No. 5,798,658 to Werking issued Aug. 25, 1998 and U.S. Pat. No. 6,229,353 to Werking issued May 8, 2001, the entire contents of each patent are incorporated herein by references.

Circuit 100 includes power supply rail Vdd 110 and power supply return rail Vss 112. Bias circuit 114 is connected between Vdd 110 and Vss 112 and provides the Vgg 118 and Vcs 116 outputs to the SCL circuitry of circuit 100. In some examples, the Vgg 118 and Vcs 116 outputs may be distributed to a large number of logic gates (not shown in FIG. 1). In some applications Vgg 118 (gate bias) may also be referred to as Vbb (base bias).

In the example of circuit 100, bias input Vcs 116 connects to the gates of n-channel metal oxide semiconductor (NMOS) current sink transistors M9 152, M10 154, M7 148 and M8 150. The source of M9 152 connects to Vss 112 through resistor R9 160, the source of M10 154 connects to Vss 112 through resistor R10 162, source of M7 148 connects to Vss 112 through resistor R7 164, source of M8 150 connects to Vss 112 through resistor R8 168. R9 160 carries the tail current $I_{R9}$ 161 and R10 162 carries current $I_{R10}$ 163.

Vgg 118 connects to the gates of NMOS transistors M2 142 and M11 156. The source of M2 142 connects to the source of M1 140 and the drain of M9 152 at voltage node V9 128. The source of M11 156 connects to the drain of M10 154 at voltage node V10 130. The value of the current through R9, $I_{R9}$, is twice that of the current flowing through R10, $I_{R10}$, (i.e., $I_{R9}=2*IR_{10}, =2*I_B$). In the example of circuit 100, the ratio of current may be set by making R9 twice as wide on an IC as R10, which may set the resistance value of R9 to half the value of R10 (i.e., R9=R10/2). To maintain accuracy, the width of M9 should also be twice as wide as M10. If unit resistors are used in the IC layout, R9 will consist of two unit resistors in parallel while R10 will consist of a single unit resistor. Likewise, M9 may consist of two transistors in parallel, each having the same size as transistor M10. Transistors M7 and M8 supply the pull-down currents for the output buffer transistors. These pull-down currents may be an integer multiple of the bias current ($n*I_B$). Resistors R7 and R8 may consist of n unit resistors in parallel and transistors M7 and M8 may consist of n unit transistors in parallel. In most situations, it is sufficient for n to have a value of 1 or 2. However, if a particular SCL logic gate is driving a large capacitive load, it may be desirable to increase the value of n (in some examples by an order of magnitude) to prevent unacceptably slow fall times for a particular application.

The digital input signal to the SCL gate of circuit 100, Vin 120, is the gate of M1 140. The p-channel MOS (PMOS) current mirrors include M5 144, M6 146 and M12 158. The sources of M5 144, M6 146 and M12 158 connect to Vdd 110. The drain of M5 144 connects to the drain of M1 140 and to the control terminal of transistor M3 106 and output of M13 102 at voltage node V1 122. The drain of M6 146 connects to the drain of M2 142, the output of M14 104 and to the control terminal of transistor M4 108 at voltage node V2 124. The drain of diode connected transistor M12 158 connects to the gates of transistors M5, 144, M6 146 and M12 158, as well as the drain of M11 156 at voltage node V11 126. M13 102 and M14 104 are voltage limiting devices that limit the magnitude of voltage at nodes V1 122 and V2 124 respectively to a predetermined voltage maximum voltage drop below the magnitude of voltage of supply voltage Vdd 110. Voltage limiting devices M13 102 and M14 104 may be implemented by a variety of components such as junction diodes, Schottky diodes, diode connected transistors or other similar voltage limiting devices.

An output driver, transistor M3 106 is supplied by Vdd 110 and the output, VO_N 132 connects to the drain of NMOS transistor M7 148. The source of M7 148 connects to Vss 112 through resistor R7 164. Similarly, the other output driver, transistor M4 108, is supplied by Vdd 110 and the output, VO 134 connects to the drain of NMOS transistor M8 150. The source of M8 150 connects to Vss 112 through resistor R8 168. In the example of circuit 100, output VO 134 is configured to be complementary to output VO_N 132. The MOSFET transistors shown in the example of circuit 100, are depicted as three terminal devices because the "bulk" terminals (not shown in FIG. 1) are connected to the source terminals. These "bulk" terminals may also be connected to the Vss 112 rail, which may cause a slight reduction in performance.

In operation for circuit 100, the pull-up transistors, M5 144 and M6 146 are biased in their saturation region and perform the function of pulling nodes V1 122 and V2 124 up to Vdd 110. The pull-up transistors, M5 144 and M6 146, therefore set the logic HIGH voltage level, $V_{OH}$, at outputs VO_N 132 and VO 134. Pull-up transistor M6 146 is arranged in a first leg of a current mirror that includes M12 158 and M5 144. Pull-up transistor M5 144 is arranged in a second leg of the current mirror. The current mirror is configured to ensure a first magnitude of current through transistor M6 146 approximately equals a second magnitude of current through pull-up transistor M5 144. All electronics are subject to some variation, for example from manufacturing process, voltage, temperature (PVT), material and other variation. In this context, approximately equal means sufficiently equal enough for circuit 100 to behave in the manner described herein within manufacturing and measurement tolerances.

In the example of circuit 100, output VO 134 may be considered a buffered logic level of the input logic level Vin 120. Output VO_N 132 may be considered an inverted logic level of the input logic level Vin 120. The added voltage limiting devices M13 102 and M14 104 perform the function of setting the logic LOW voltage level, $V_{OL}$, for outputs VO_N 132 and VO 134. The added voltage limiting devices M13 102 and M14 104 allows bias circuit 114 to be greatly simplified when compared to SCL circuits without voltage limiting devices to set the logic LOW voltage. In this disclosure, the term "logic level" may refer to the voltage level or voltage magnitude and the term "logic value" may refer to the HIGH or LOW logic value. However, logic level and logic value may be used interchangeably in this disclosure, unless otherwise noted. Also, as discussed above, outputs VO_N 132 and VO 134 may be combined with outputs from other logic gates using similar techniques to form other SCL based components, e.g. a flip-flop, AND/NAND gates and similar components.

Input transistor M1 140 and pull-up transistor M5 144 connect to the V1 122 node which drives the control terminal of output device M3 106. When the input signal to Vin 120 is LOW, M1 140 is OFF and transistor M5 144 sources a current equal to a bias current, with magnitude $I_B$, which will quickly pull V1 122 to the Vdd 110 rail. When Vin 120 is HIGH, M1 140 is ON and all of the current from M9 152 (with a magnitude of twice the bias current $2 \times I_B$) passes through M1 140 pulling node V1 122 low. In circuit 100, the magnitude of the net current pulling V1 122 low is $2I_B - I_B = I_B$. The voltage on node V1 122 is limited by voltage limiting device M13 102 which conducts this net current. Therefore, it is M13 102 (and the matching M14 104) that sets magnitude of the logic LOW voltage, $V_{OL}$, of the gate and not the bias network.

Circuit 100 is configured such that node V1 122 and V2 124 are pulled up and down with equal currents, e.g. bias current magnitude $I_B$. Using an equal current causes the rise and fall times (dV/dt) on the SCL gate outputs of M3 106 and M4 108 to be approximately equal.

Transistor M11 156 in circuit 100 is configured to help minimize current mismatches between transistors M9 152 and M10 154 which may be caused by channel length modulation effects. Though channel length modulation effects may be of minor importance, such effects may become significant at either small process critical dimensions or high operating voltages. Transistor M11 156 may be referred to as a normalizing transistor.

Figure 2A:
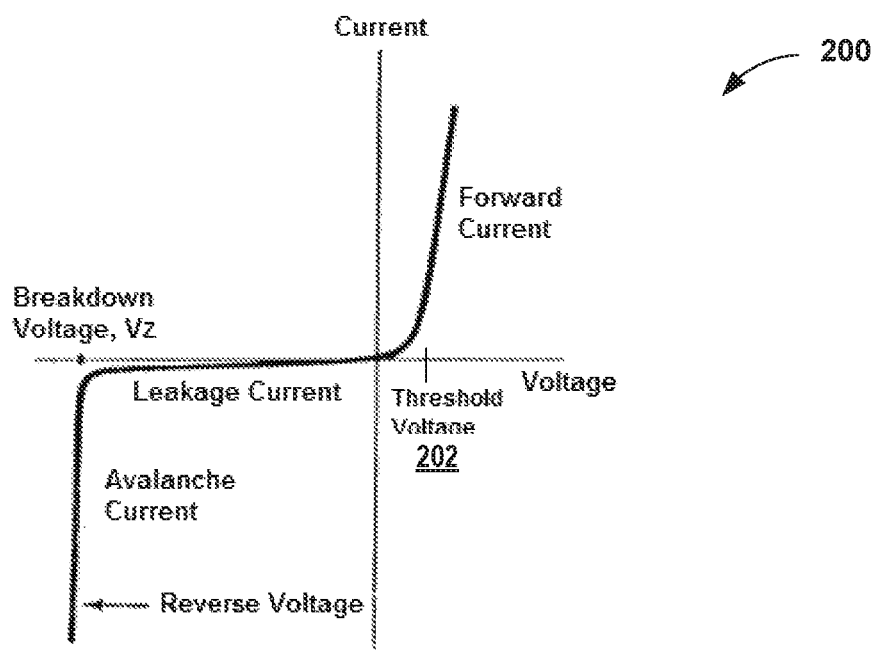
FIG. 2A is a graph of a diode I-V characteristic curve.

FIG. 2A is a graph of a junction diode I-V characteristic curve. In some examples, voltage limiting devices M13 102 and M14 104 may be implemented as a junction diode. By selecting the dimensions and other characteristics of voltage limiting devices M13 102 and M14 104, to limit the voltage at nodes V1 122 and V2 124 to a predetermined value below Vdd 110. In other examples voltage limiting devices M13 102 and M14 104 may be implemented as a Schottky diode, Zener diode or other devices to perform a similar voltage limiting function.

Figure 2B:
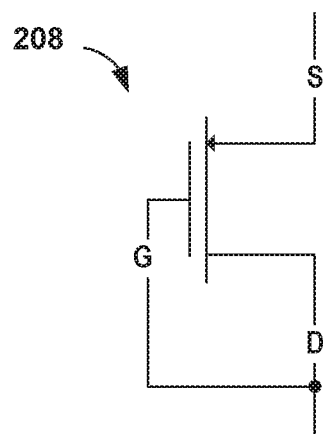
FIG. 2B is a schematic diagram illustrating a diode connected p-channel MOSFET.
Figure 2C:
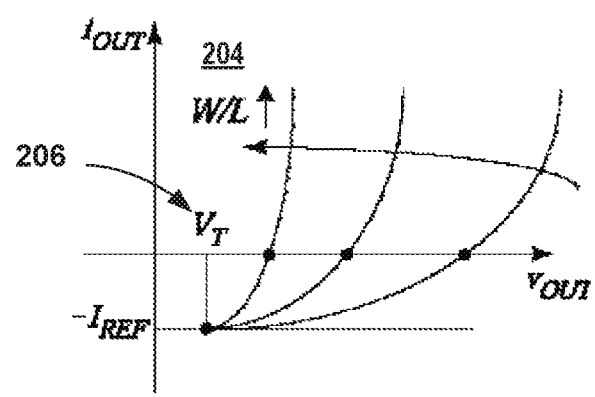
FIG. 2C is a graph of the impact of W/L ratio on voltage of a diode connected transistor.

FIG. 2B is a schematic diagram illustrating a diode connected p-channel MOSFET. A diode connected transistor is always in saturation because Vds=Vgs, so Vds>(Vgs−Vt), where Vt is the threshold voltage. Beyond the threshold voltage, of the MOSFET, the MOSFET may perform similar to a diode with quadratic I-V characteristics. A MOSFET threshold voltage VT 206 is shown in FIG. 2C and for a PN junction diode, threshold voltage 202 is shown in FIG. 2A. Because a FET may be a square-law device, the I-V curve may be soft compared to the I-V curve of the PN junction diode. Voltage limiting devices M13 102 and M14 104 may also be implemented as a diode connected transistor 208, and therefore becomes a two-terminal device.

FIG. 2C is a graph of the impact of W/L ratio 204 on voltage of a diode connected transistor. As shown in FIG. 2C, as the W/L ratio increases, the voltage across the transistor may decrease.

Figure 3A:
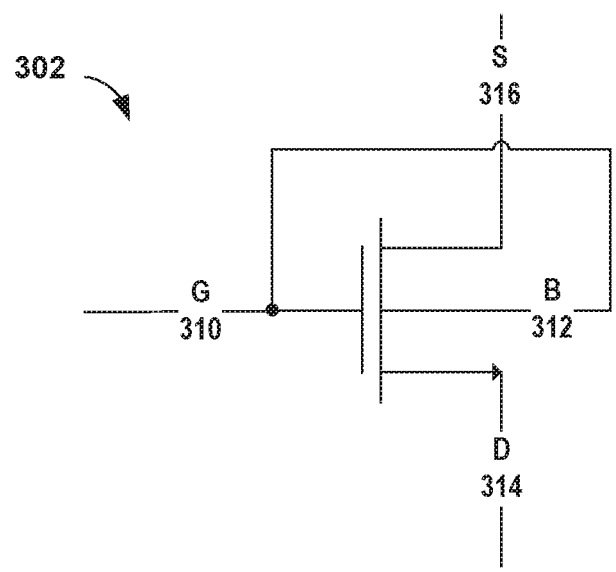
FIG. 3A is a schematic diagram illustrating a four-terminal dynamic threshold (DT) MOSFET.

FIG. 3A is a schematic diagram illustrating a four-terminal dynamic threshold (DT) MOSFET. The four terminals of DT MOSFET 302 include source 316, drain 314, gate 310 and bulk 312 terminals. Connecting gate 310 and bulk 312 terminals of a MOSFET together forms a "dynamic threshold" MOSFET. A DT MOSFET may also be referred to as a "super-Beta" bipolar transistor and use the more compact symbol shown in FIG. 3B.

Figure 3B:
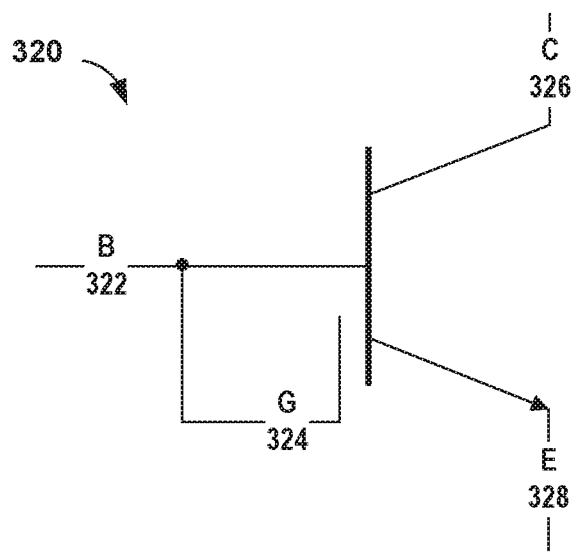
FIG. 3B is a schematic diagram illustrating an alternative bipolar junction transistor (BJT) schematic symbol for a DT MOSFET.

FIG. 3B is a schematic diagram illustrating an alternative bipolar junction transistor (BJT) schematic symbol for a DT MOSFET. Here, a fourth "gate" terminal 324 is added to the standard symbol for a BJT, which includes base 322, collector 326 and emitter 328. When modeled as a bipolar transistor, such DT MOSFETs may have an equivalent beta on the order of 10,000 or more due to their extremely low base currents. Since both schematic representations are equivalent, this disclosure will use the BJT representation to emphasize the fact that the voltage drop between base 322 and emitter 328 terminals is essentially constant as a function of emitter current.

Figure 4:
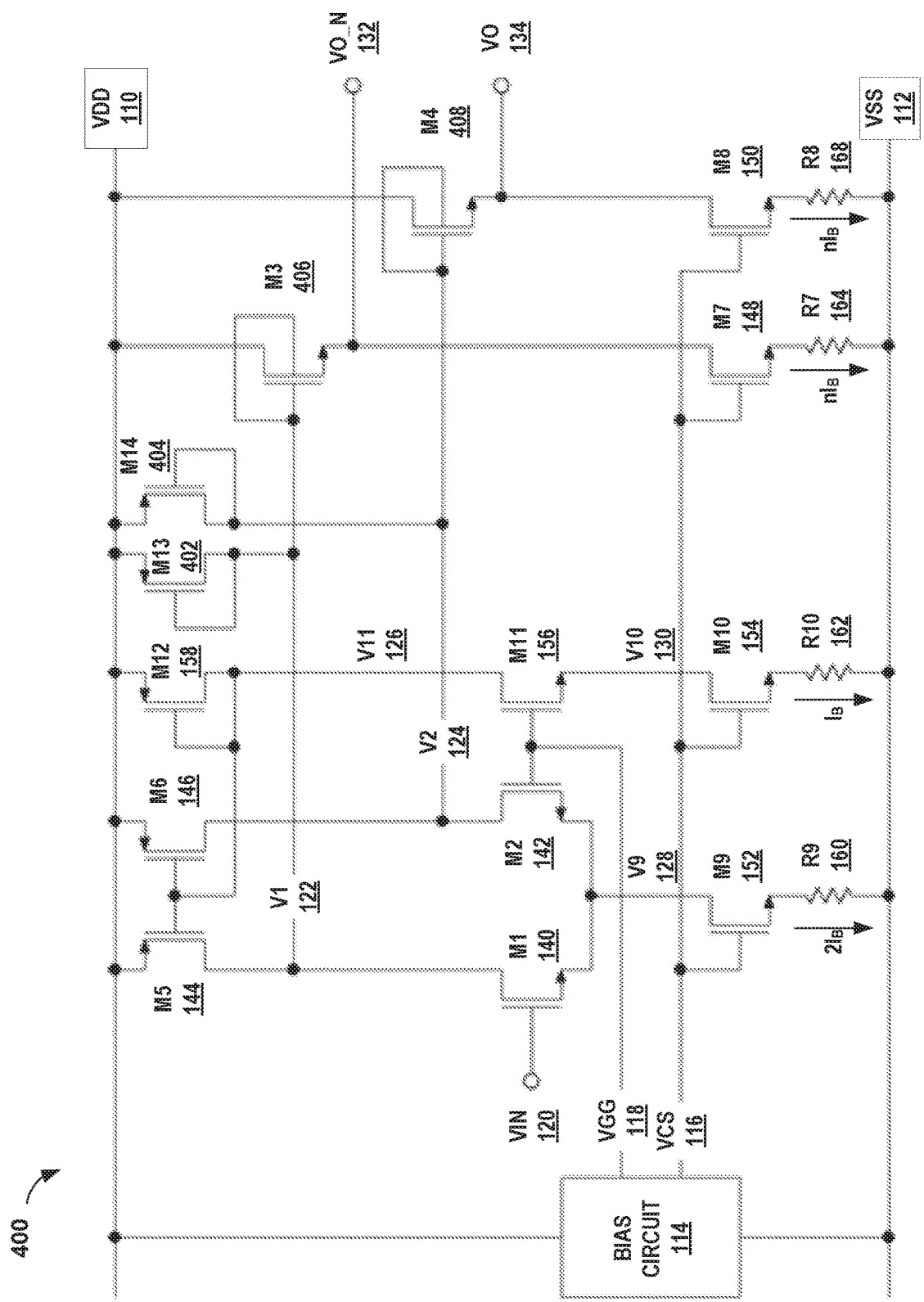
FIG. 4 is a schematic diagram illustrating an example implementation of the SCL gate of this disclosure with DT MOSFET as source-follower output drivers.

FIG. 4 is a schematic diagram illustrating an example implementation of the SCL gate of this disclosure with DT MOSFET as source-follower output drivers. Circuit 400 is an example of circuit 100 shown in FIG. 1, with diode connected transistors M13 402 and M14 404 performing the functions of current limiting devices M13 102 and M14 104 depicted in FIG. 1. Also, source-follower output drivers M3 406 and M4 408 perform the functions of transistor M3 106 and transistor M4 108 as described above in relation to FIG. 1.

In circuit 400, the source of diode-connected PMOS transistor M13 402 connects to Vdd 110 and the drain of M13 402 connects to both node V1 122 and the gate of M13 402. Similarly, the source of diode-connected PMOS transistor M14 404 connects to Vdd 110 and the drain of M14 404 connects to both node V2 124 and the gate of M14 404. As described above in relation to FIGS. 2B and 2C, the width to length (W/L) ratio of M13 102 (and M14 104) determines the voltage drop from Vdd 110. Selecting the W/L ratio of M13 102 and M14 104 may be used to adjust the value of $V_{OL}$ over a wide range of voltage levels.

As described above in relation to FIGS. 3A and 3B, the bulk of output driver transistor M3 406 connects to the gate of M3 406 and the bulk of output driver transistor M4 408 connects to the gate of M4 408. The drains of both M3 406 and M4 408 connect to Vdd 110. The source of M3 406 connects to the drain of M7 148 and the source of M4 408 connects to the drain of M8 150.

The remaining components and arrangement of circuit 400 is otherwise the same as circuit 100 described above in relation to FIG. 1. Diode connected transistors M13 402 and M14 404 are examples of current limiting devices M13 102 and M14 104 depicted in FIG. 1. Output drivers M3 406 and M4 408 are examples of output drivers M3 106 and transistor M4 108 depicted in FIG. 1. The characteristics, functions and operation of circuit 400 therefore may be similar to the characteristics, functions and operation of circuit 100 described above in relation to FIG. 1.

Circuit performance for the SCL gate of circuits 100 and 400, as well as for other circuits, may be measured by determining gate propagation delay, toggle frequency, speed, power consumption, an output rise time, an output fall time, a speed-power product and other performance characteristics. The propagation delay of the SCL gate of circuits 100 and 400 may be impacted by the capacitances on three nodes: V1 122, V2 124, and V9 128. For the buffer-inverter of circuits 100 and 400, the effect of the capacitances on V1 122 and V2 124 dominate the overall circuit propagation delay.

By making the W/L ratio of M13 402 and M14 404 large, the difference between the HIGH and LOW output voltages, Vdiff=VOH−VOL may decrease. Reducing Vdiff may help reduce the gate propagation delay. However, the ramp rate (or slope) (dV/dt) of the rising and falling ramps as the circuit switches between $V_{OH}$ and $V_{OL}$ also impacts propagation delay. Increasing the W/L ratio of M13 402 and M14 404 not only changes Vdiff, but also increases the capacitance for M13 402 and M14 404 so that the ramp rates (dV/dt) on nodes V1 122 and V2 124 decrease along with the reduced logic voltage swing caused by decreasing Vdiff. Since the capacitance increases faster than output voltage swing decreases, there are advantages to use the minimum W/L possible for M13 402 and M14 404. Also, because the total capacitance on nodes V1 122 and V2 124 determines performance there are also advantages to minimize the W/L ratio of M5 144 and M6 145 for the best propagation delay performance.

In other examples, some SCL techniques do not include voltage limiting devices M13 402 and M14 404. Therefore, the total capacitance of nodes connected to the gates of the output devices of such circuits, similar to output devices M3 406 and M4 408, may be less than the total capacitance of nodes V1 122 and V2 124 shown in the example of circuits 100 and 400. Moreover, the pull-up transistors for such circuits must perform a dual function of setting both the HIGH voltage level and LOW voltage level. Thus, pull-up transistors in other examples of SCL circuits without voltage limiting devices M13 102 and M14 104 may have lower capacitance when compared to M5 144 and M6 146 of circuit 100 because those other pull-up transistors may operate at a higher gate-source voltage $V_{GS}$ when compared to M5 144 and M6 146 of circuits 100 and 400. However, circuit 400 may still have advantages over other examples of SCL circuits because the effect of the output transistors M3 406 and M4 408 may also improve the performance of circuit 100 when compared to other SCL techniques.

Figure 5:
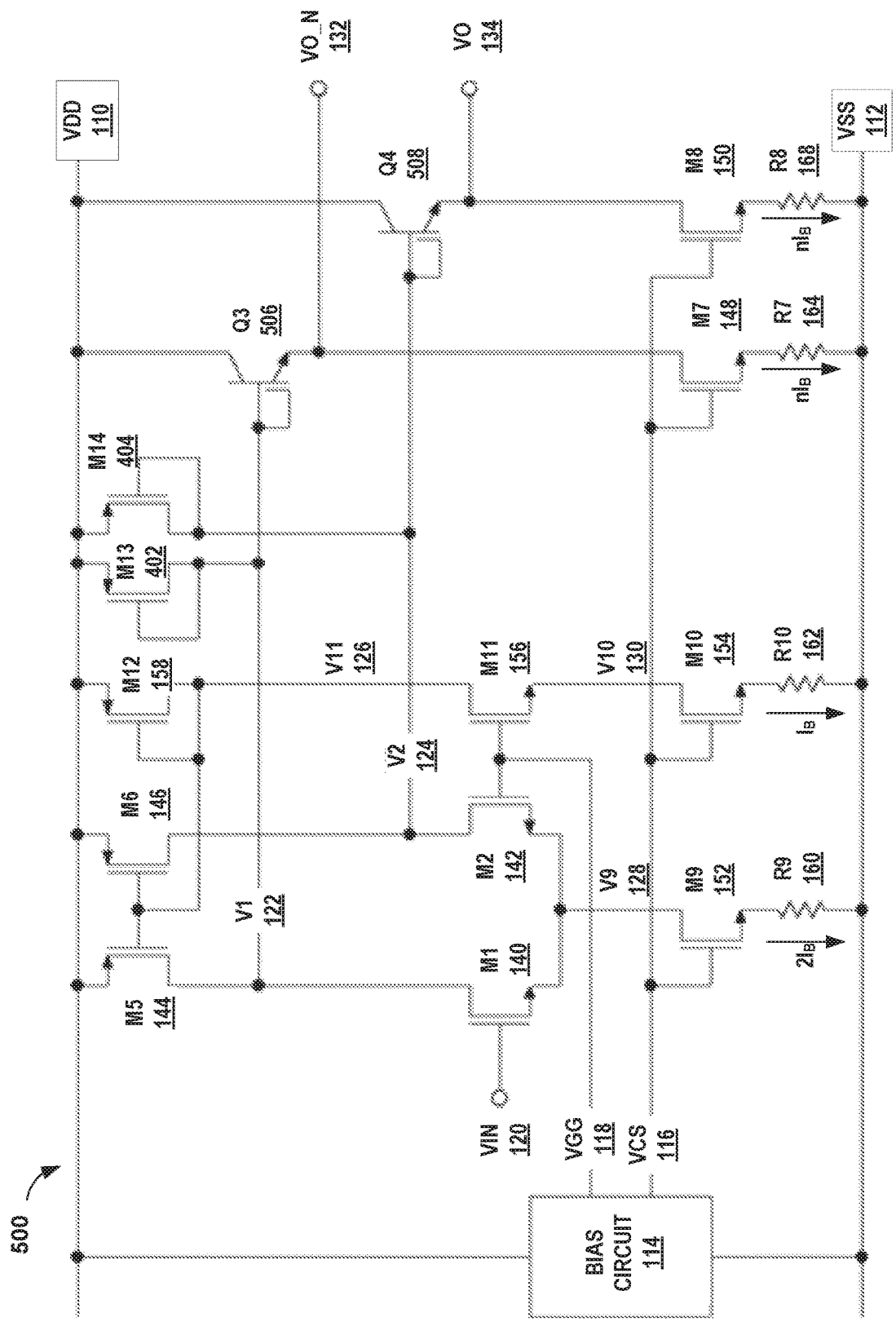
FIG. 5 is a schematic diagram illustrating an example implementation of the SLC gate of this disclosure with DT MOSFET source-follower output drivers shown as BJT super beta transistors.

FIG. 5 is a schematic diagram illustrating an example implementation of the SCL gate of this disclosure with DT MOSFET source-follower output drivers shown as BJT super beta transistors. Circuit 500 is an example circuit 400 described above in relation to FIG. 4. Output drivers Q3 506 and Q4 508 perform the functions of M3 406 and M4 408, as well as the functions of M3 106 and M4 106 described above in relation to FIGS. 1 and 4. Thus the characteristics, functions and operation of circuit 500 is the same as described above for circuit 400 and may be similar to the characteristics, functions and operation of circuit 100 described above in relation to FIG. 1, unless otherwise noted.

In circuit 500, the collector of Q3 506 and the collector of Q4 508 connect to Vdd 110. The emitter of Q3 506 connects to the drain of M7 148 and provides output VO_N 132. The emitter of Q4 508 connects to the drain of M8 150 and provides output VO 134. V1 122 connects to the base of Q3 506 and V2 124 connects to the base of Q4 508.

Figure 6:
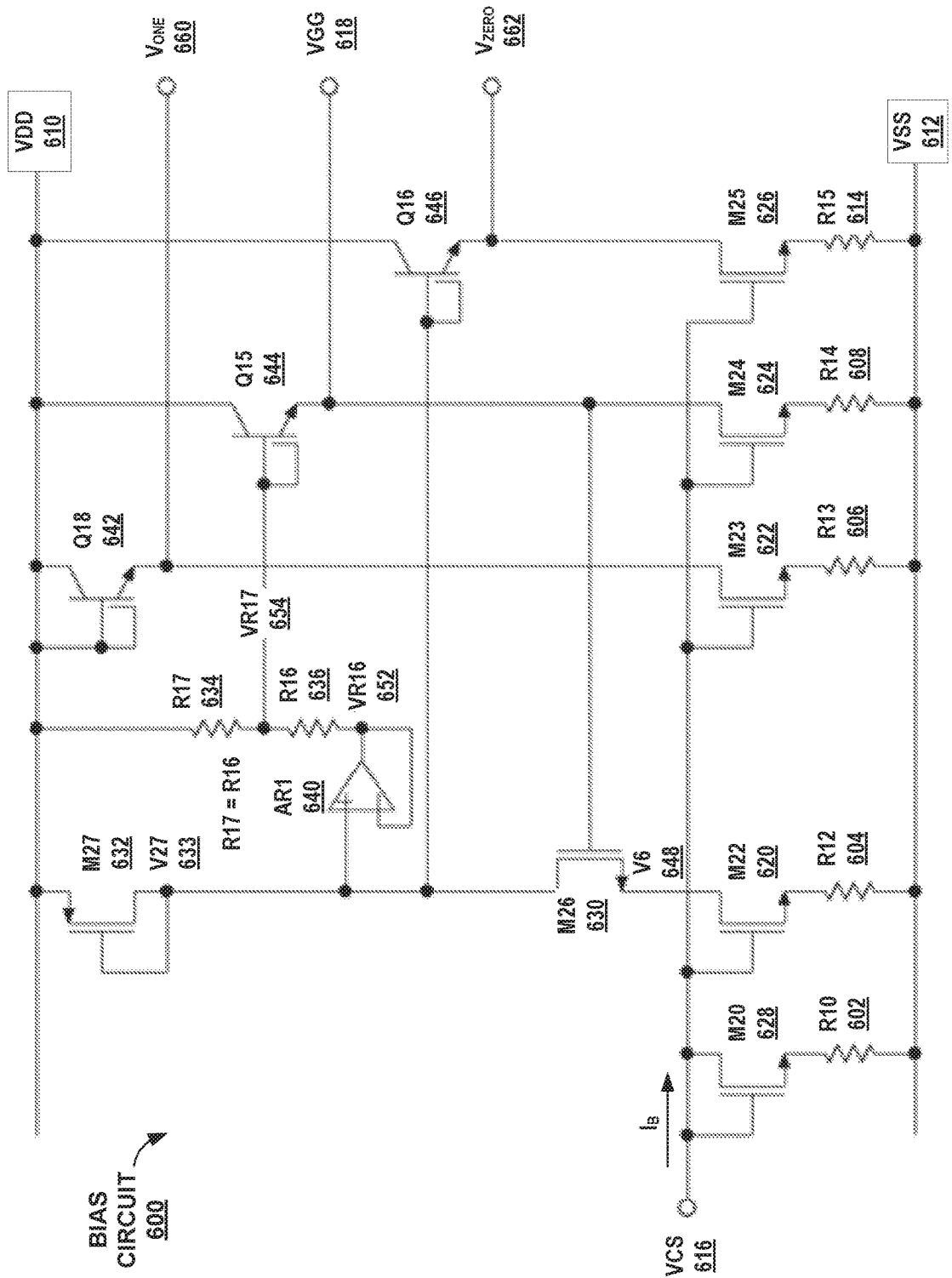
FIG. 6 is a schematic diagram illustrating an example implementation of a bias circuit for the SCL gate of this disclosure.

FIG. 6 is a schematic diagram illustrating an example implementation of a bias circuit for the SCL gate of this disclosure. Bias circuit 600 is an example of bias circuit 114 described above in relation to FIG. 1 and depicted in FIGS. 1, 4, and 5.

In circuit 600, the $V_{CS}$ terminal, $V_{CS}$ 616 is both an input and an output, similar to $V_{CS}$ 116 output as described above in relation to FIG. 1. Circuit 600 provides three other outputs $V_{ONE}$ 660, $V_{ZERO}$ 662 and Vgg 618. Vgg 618 is an example of Vgg 118 described above in relation to FIG. 1. The outputs $V_{ONE}$ 660 and $V_{ZERO}$ 662 may not be strictly necessary for the examples of circuits 100, 400 and 500 described above in relation to FIGS. 1, 4 and 5. But $V_{ONE}$

660 and $V_{ZERO}$ 662 may be used to bias any unused SCL inputs in a mixed-mode IC, if needed.

The voltage applied to the $V_{CS}$ terminal, $V_{CS}$ 616, drives the bias current, $I_B$ through transistor M20 628 and resistor R10 602 as well as the remaining pull-down transistors, or current sinks. The gates of NMOS transistors M20 628, M22 620, M23 622, M24 624, and M25 626 connect to Vcs 616. The drain of M20 628 also connects to Vcs 616. In some examples, a constant current source from an external circuit may be applied to the Vcs 616 pin that causes a voltage to be developed across resistor R10 602 and diode-connected transistor M20 628. The developed voltage is then used to drive the gates of the source-follower transistors M22 620, M23 622, M24 624, and M25 626. The source-follower transistors M22-M25 in turn drive the voltages across R12 604, R13 606, R14 608 and R55 614 to be the same as the voltage across R10 602; thus, regulating the currents through the respective branches of bias circuit 600.

The source of M20 628 connects to Vss 612 through resistor R10 602. Similarly, the source of M22 620 connects to Vss 612 through resistor R12 604, the source of M23 622 connects to Vss 612 through resistor R13 606, the source of M24 624 connects to Vss 612 through resistor R14 608, and the source of M25 626 connects to Vss 612 through resistor R15 614. In some examples Vss 612 may also connect to Vss 112 described above in relation to FIG. 1 (not shown in FIG. 6). In principle, the value of n used to scale the output pull-down currents should be the same in both the bias circuit and the SCL gates that are connected to it. However, in practice, differences in the "n" factor may cause only slight shifts in the logic levels that may not significant for many applications.

The source of NMOS transistor M26 630 connects to the drain of M22 620 while the drain connects to the drain and gate of diode-connected PMOS transistor M27 632 at voltage node V27 633. Similar to transistor M11 156, described above in relation to FIG. 1 and depicted in FIGS. 4 and 5, transistor M26 630 in bias circuit 600 is configured to maintain the accuracy of the $I_B$ pull-down current, which may be affected by channel length modulation effects.

Also connected to node V27 633 is the non-inverting input of unity gain buffer AR1 640 and the base of super beta transistor Q16 646, which drives the $V_{ZERO}$ 662 output terminal. The emitter of Q16 646 connects $V_{ZERO}$ 662 and to the drain of current sink transistor M25 626.

Both the inverting input and the output of AR1 640 connect to voltage node VR16 652, which connects to a first terminal of resistor R16 636. The opposite terminal of R16 636 connects to Vdd 610 through resistor R17 634. In the example of bias circuit 600, R16 636 and R17 634 form a resistor divider in which the value of R16 636 is configured to be approximately equal to R17 634, within manufacturing and measurement tolerances.

Voltage node VR17 654, between resistors R16 636 and R17 634 connects to the base of DT MOSFET transistor Q15 644. The collector of Q15 644 connects to Vdd 610 and the emitter of Q15 644 connects to the drain of current sink transistor M24 624 and provides the bias signal Vgg 618. Similarly, the collector of Q18 642 connects to Vdd 610 and the emitter of Q18 642 connects to the drain of current sink transistor M23 622 and drives the $V_{ONE}$ 660 output. Transistors Q18 642, Q15 644 and Q16 646 form three emitter-follower circuits that are approximately the same, within manufacturing and measurement tolerances to drive outputs Vgg 618, $V_{ONE}$ 660 and $V_{ZERO}$ 662.

In operation, transistor Q18 642 drives the $V_{ONE}$ 660 output to the HIGH logic voltage level. Transistor Q16 646 drives $V_{ZERO}$ 662 output to the LOW logic voltage level. The voltage level of V27 633 connected to the base of Q16 646 is limited by voltage limiting diode-connected MOSFET M27 632, similar to M13 102 and M14 104 described above in relation to FIG. 1. The voltage limiting device in the bias circuit at M27 should approximately match the voltage limiting devices M13 102 and M14 104. For example, the dimensions, such as a width-to-length ratio (W/L), of diode connected transistor M27 632 should approximately match the dimensions of diode connected transistors M13 402 and M14 404 described above in relation to FIG. 4 and also depicted in FIG. 5. In the example of a different voltage limiting device used in place of M27 632, e.g. a Zener diode, then a Zener diode that approximately matches the Zener diode of M27 632 should be used for M13 402 and M14 404. As described above in relation to FIG. 1, in this context, approximately matching means sufficiently equal for the circuit to behave in the manner described herein within manufacturing and measurement tolerances.

With one end of the resistor divider connected through unity gain buffer AR1 640 to node V27 633 and the opposite end of the resistor divider, i.e. the opposite terminal of R17 634 connected to Vdd 610, the magnitude of voltage node VR17 654 is configured to be approximately half of the voltage difference between Vdd 610 and V27 633, the voltage used to drive Q16 646. Therefore, node VR17 654 causes transistor Q15 644 to drive the Vgg 618 output to a logic threshold level (aka a voltage magnitude) that is approximately half-way between the magnitude of $V_{ONE}$ 660 and $V_{ZERO}$ 662.

The use of source degeneration resistors for all current sinks in both bias circuit 600 (i.e. R10 602, R12 604, R13 606, R14 608 and R15 614) see M1-M5) and the SCL gate circuits 100, 400 and 500 (i.e. R9 160, R10 162, R7 164 and R8 168) is one measure to simplify bias circuit 600. The use of source degeneration resistors reduces the effect of mismatches in the NMOS transistors so that a single current source voltage, i.e. Vcs 116 and Vcs 616, may be distributed to a large number of logic gates than would otherwise not be possible with other techniques. This technique may be used in analog circuits and ECL logic gates. However, the SCL current sinks of this disclosure use NMOS transistors with essentially zero gate currents. Therefore, one Vcs output from a bias circuit, e.g. Vcs 616 of bias circuit 600, could drive the Vcs inputs for many logic gate inputs without any significant DC loss.

As described above in relation to FIG. 1, both Vgg 618 and Vcs 616 may be distributed to bias a large number of logic gates (not shown in FIG. 6). The VCS voltage output Vcs 616 may also be used as an output to drive the Vcs inputs of any number of logic gates similar in structure to the buffer-inverter circuit described above in relation to FIGS. 1, 4 and 5. In principle, Vcs 616 output could drive thousands of Vcs inputs without any significant DC loss. However, in practice it may be desirable to limit the number of SCL logic gates that share a common VCS bus, in order to limit the coupling of high speed transients to unwanted locations, e.g. through M7 148 and M8 150, described above in relation to FIG. 1. This form of logic crosstalk may be mitigated by adding capacitors to the VCS bus, inserting active buffers, or just adding more bias cells.

Also note that bias circuit 600 includes only one buffer, AR1 640. Other SCL techniques may require four or more op amps in the bias circuit, which may be one factor that has limited the prior adoption of SCL. In this manner, the arrangement of the SCL gate depicted in FIGS. 1, 4 and 5 allows for reduced complexity for bias circuit 600.

Figure 7:
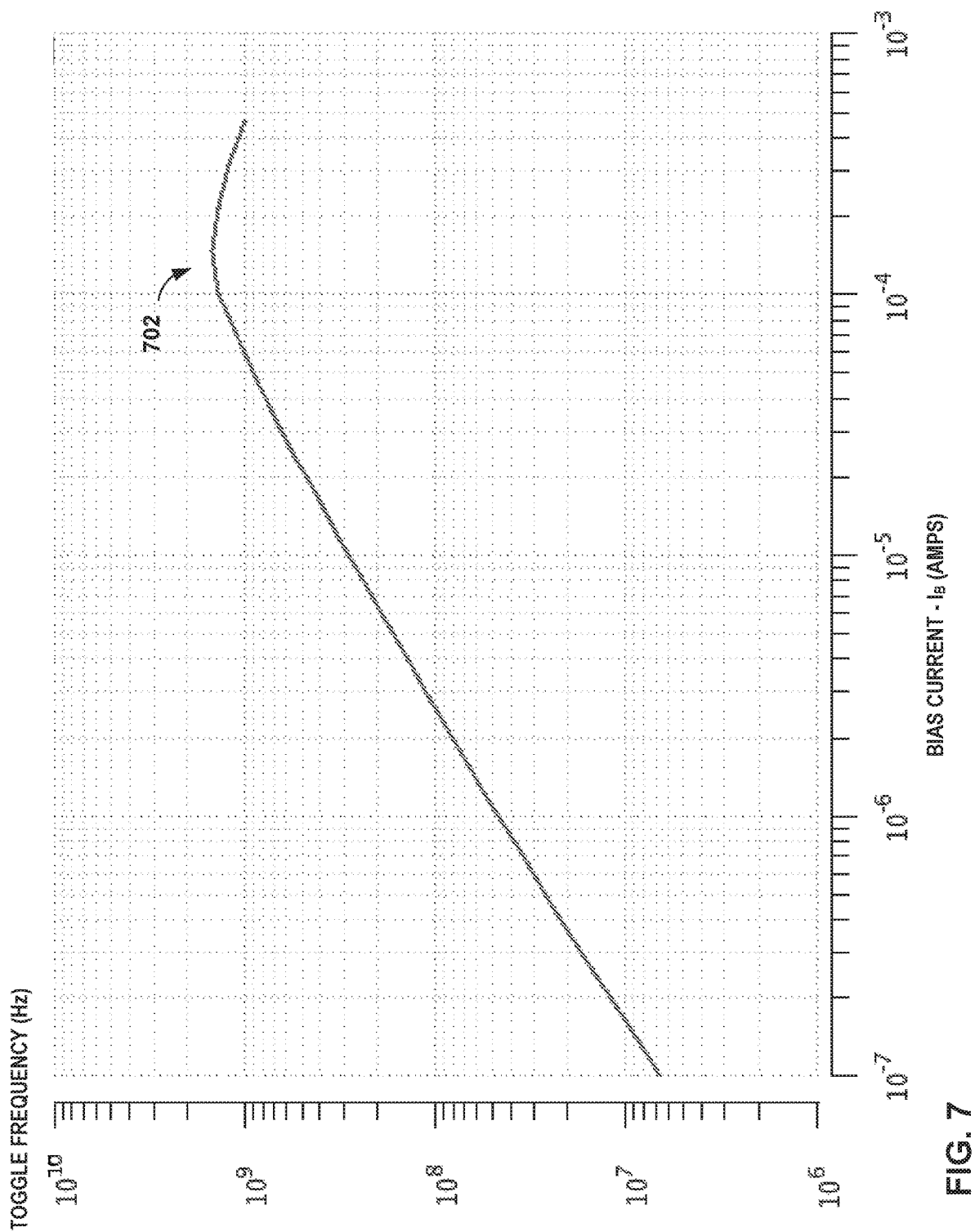
FIG. 7 is a graph illustrating an example performance characteristic of an example SCL logic gate as a function of bias current.

FIG. 7 is a graph illustrating an example performance characteristic of an example SCL logic gate as a function of bias current. As described above in relation to FIG. 4, in addition to gate propagation delay, toggle frequency of a flip-flop is one measure of circuit performance. FIG. 7 describes an example of how toggle frequency may change based on changes to the bias current, $I_B$. A bias current, $I_B$, was described above in relation to FIGS. 1, 4, 5 and 6. FIG. 7 depicts a simulation of changes in toggle frequency for a T-type flip-flop implemented using a 350 nm SOI process and the SCL techniques for the buffer-inverter circuits described above in relation to FIGS. 1, 4, 5 and 6. FIG. 7 illustrates how the toggle frequency for such a flip-flop changes as the bias current changes over four orders of magnitude at room temperature.

For SCL, toggle frequency is proportional to the transconductance (gm) of the transistors used in the gain stage (or input pair) of the gate. Transconductance in turn is proportional to the square root of the bias current (specifically, tail current) applied to the transistors in the gain stage. Tail current, $I_{R9}$ 161 was described above in relation to FIG. 1. The toggle frequency of the T-type flip-flop steadily increases as the bias current increases until it reaches a maximum and then briefly decays before ceasing to operate altogether. This peaking behavior (702) is caused by the behavior the signals depicted in FIG. 1 of Vcs 116, Vgg 118, and the tail current, equal to $I_{R9}$ 161, vary as a function of bias current $I_B$.

Figure 8:
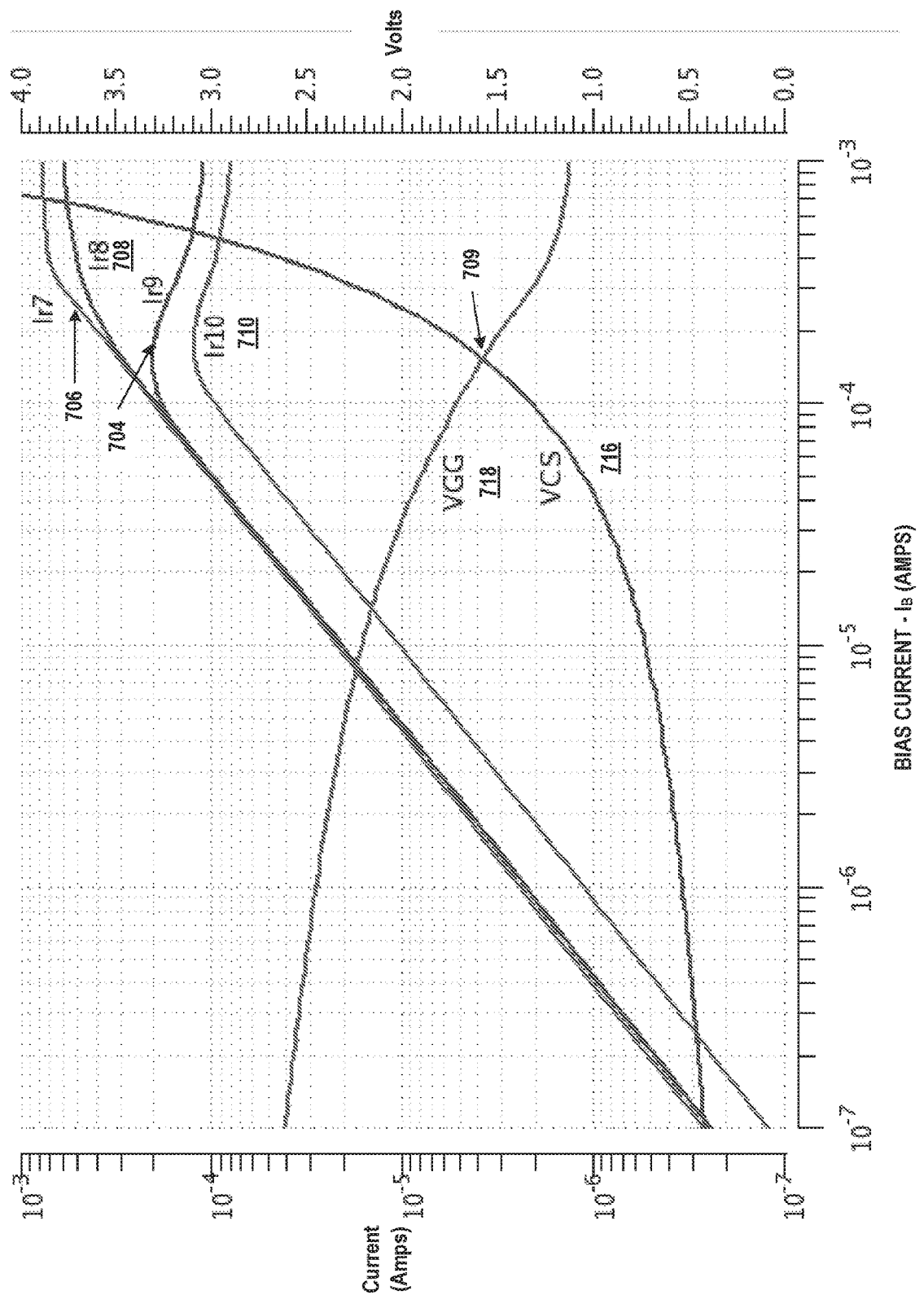
FIG. 8. is a graph illustrating changes in circuit parameters as a function of bias current.

FIG. 8. is a graph illustrating changes in SCL gate circuit parameters as a function of bias current. The signals depicted in FIG. 1 for circuits 100, 400 and 500 that impact the toggle frequency depicted in FIG. 7 are Vcs 116, Vgg 118, and the tail current $I_{R9}$ 161, are plotted in FIG. 8 as the signals vary as a function of bias current $I_B$.

As shown by the example of FIG. 8, both the tail current, $I_{R9}$ 704, and the current equal to $I_{R10}$ 710, supplied to the PMOS current mirrors (M5 144, M6 146, M12 158 depicted in FIG. 1) follow $I_B$ until the value of Vcs 716 is equal to Vgg 718 (709). Then as Vgg 718 decreases, the values of currents $I_{R9}$ 704 and $I_{R10}$ 710 also decrease. The schematic diagrams of FIGS. 1, 4 and 5 show that the current through R10 162 is a function of the two voltages applied to the gates of M10 154 and M11 156, i.e., Vcs 116 and Vgg 118 respectively. In fact, the smaller of these two voltages determines the value of $I_{R10}$ 163 depicted in FIG. 1, which can be seen by comparing the plot of $I_{R10}$ 710 with the plot of Vgg 718 as the bias current increases at intersection 709.

When Vin 120 is at a logic HIGH, then M1 140 is ON and M2 142 is OFF. Thus, when Vin 120 is HIGH, a current with magnitude $I_B$ flows through M5 144, a current $I_B$ flows through M13 102, and a current $2 \times I_B$ flows through M1 140 and M9 152. When the input voltage signal to Vin 120 is at a logic LOW, then M1 140 is OFF and M2 142 is ON. Thus, when Vin 120 is LOW, a current with magnitude $I_B$ flows through M6 146, a current $I_B$ flows through M14 104, and a current $2 \times I_B$ flows through M2 142 and M9 152. As described above in relation to FIG. 1, the rise time of the voltage magnitude $V_{OH}$ is based on the respective current through the pull-up transistors M5 144 and M6 146. The fall time to the voltage magnitude $V_{OL}$ is based on the current through M9 152. Rise time and fall time are related to ramp rate (dV/dt). In other words, the rising ramp rate is the magnitude of voltage change divided by the rise time.

When Vgg 718 is less than Vcs 716, the $I_{R9}$ 704 and $I_{R10}$ 710 currents continue to track each other and the logic gate continues to function (albeit at a lower level of performance) until the current sources for the output emitter-followers (Q3 506 and Q4 508 of FIG. 5) saturate. This is shown in FIG. 8 where the $I_{R7}$ 706 and $I_{R8}$ 708 currents level off.

Figure 9:
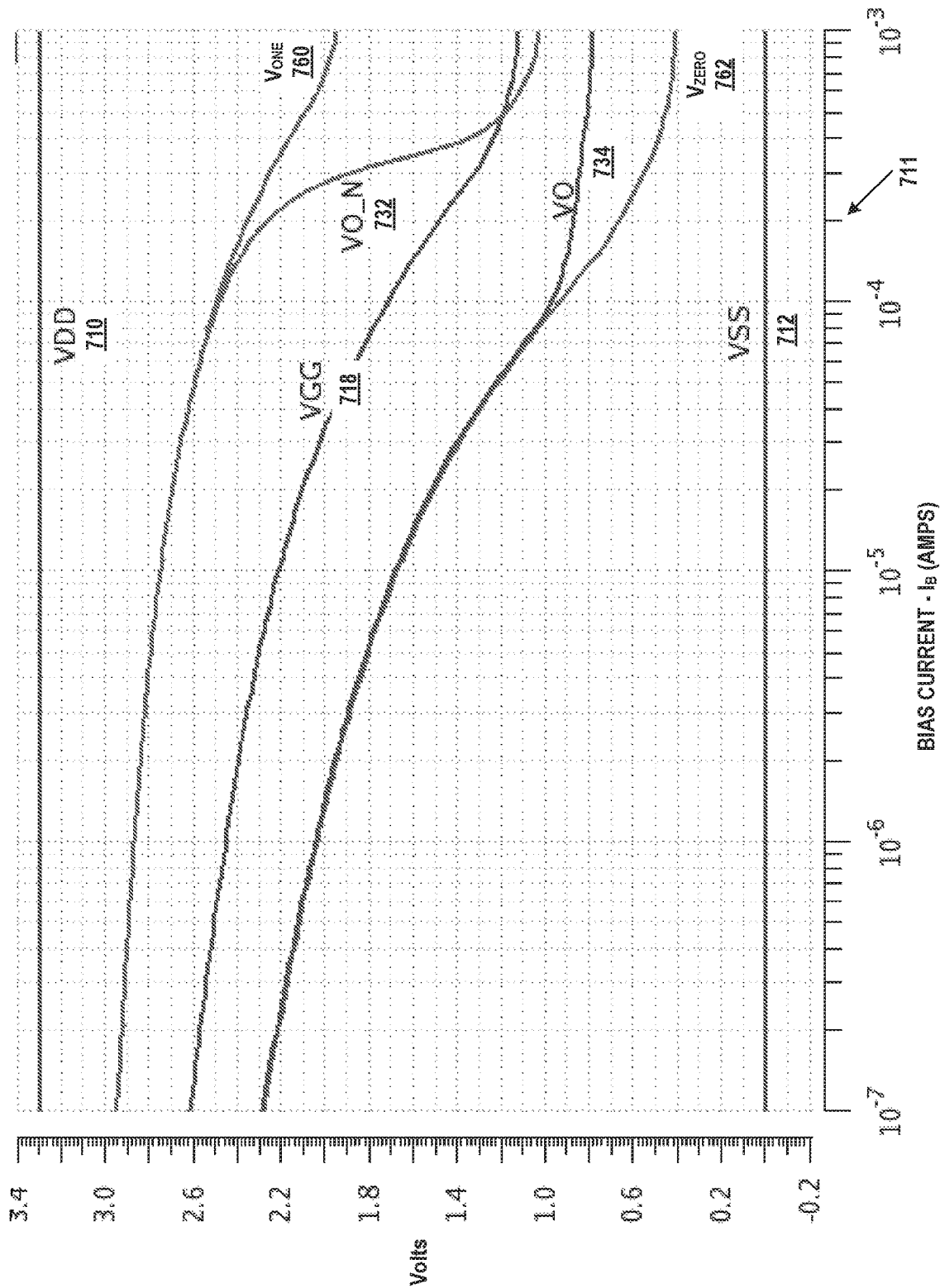
FIG. 9. is a graph illustrating changes in output voltages for the bias circuit and the logic gate as a function of bias current.

FIG. 9. is a graph illustrating changes in output voltages for the bias circuit and the logic gate as a function of bias current. Similar to FIG. 8 above, signals depicted in FIG. 6 for bias circuit 600 and shown in the graph of FIG. 9 include output signals $V_{ONE}$ 660, $V_{ZERO}$ 662 and Vgg 618, the power rail Vdd 610 and Vss 612. The graph of FIG. 9 also shows the impact of changes in bias current on the output signals of circuits 100, 400 and 500, i.e. VO_N 132 and VO 134. These signals are depicted in FIG. 9 as Vdd 710, Vss 712, VO_N 732, VO 734, $V_{ONE}$ 760, and $V_{ZERO}$ 762. Signal Vgg 718 in FIG. 9 has the same shape and characteristics as signal Vgg 718 described above in relation to FIG. 8.

As described above in relation to FIG. 8, when Vgg 718 is less than Vcs 716, the $I_{R9}$ 704 and $I_{R10}$ 710 currents continue to track each other and the logic gate continues to function (albeit at a lower level of performance) until the current sources for the output emitter-followers (Q3 506 and Q4 508 of FIG. 5) saturate. The tracking behavior can be seen where the logic gate output voltages, VO_N 732 and VO 734, depart from the in the bias circuit signals $V_{ONE}$ 760, and $V_{ZERO}$ 762 voltages (711).

As can be seen by FIGS. 8 and 9, one advantage of the techniques of this disclosure include that by choosing the appropriate value of $I_B$ the output logic levels of the SCL gate described above in relation to FIGS. 1, 4, 5 and 6 may become compatible with emitter coupled logic (ECL) gates. In other words, if the circuit simulated in FIG. 7 were powered with Vdd 710=0V and Vss 712=−3.3V, then the $V_{ONE}$ 760 output would be greater than −0.98V and the $V_{ZERO}$ 762 output would be less than −1.63V whenever 10 µA<$I_B$<100 µA. Likewise, SCL inputs are compatible with ECL outputs over an even wider range of $I_B$. The circuit simulated in FIG. 7 could function as an ECL to SCL translator simply by connecting the Vgg 118 input from bias circuit 114 instead to an ECL Vbb=−1.3V reference whenever $I_B$<40 µA.

As described above in relation to FIG. 4, the effect of the output transistors may also improve the performance of the SCL gate of this disclosure when compared to other SCL techniques. For example, one advantage of using the super-Beta NPN emitter-followers (M3 406, M4 408, Q3 504 and Q4 508 depicted in FIGS. 4 and 5) a standard transistor configured as a source-follower is that the super-Beta NPN transistor (aka DT MOSFET) may support larger currents at a given supply voltage due to the lower voltage drop between the base and emitter terminals. Therefore, a super-Beta NPN output transistor may allow a logic gate to operate at about twice the current or approximately a 40% higher maximum toggle frequency.

Another advantage of the techniques of this disclosure include the programmability of the performance of the SCL gate by means of adjusting the bias current, $I_B$. The programmability feature may allow SCL circuits that do not need high performance to operate at a reduced power consumption. In some examples, this bias current may be set dynamically so that high power is consumed only when high power is needed. It should also be noted that if lower power consumption is not needed for a given application, then it is not necessary to supply an external current source to the bias circuit, as described above in relation to FIG. 6. Instead, for such applications that do not have power consumption concerns, a simplified biasing configuration for high performance may be achieved by connecting the Vgg 618 output of the bias cell (as depicted in FIG. 6) to the Vcs 616 input.

In the examples of FIGS. 7-9, the simulation of circuits are depicted for bias currents with a maximum value of approximately 0.1 mA. A bias current, $I_B$ of 0.1 mA produces an input pair tail current, $I_{R9}$ 161 depicted in FIG. 1, of approximately 0.2 mA. SCL gates operating with a bias current, $I_B$ of 0.1 mA may be sufficient for logic gates communicating internally within an IP block or between IP blocks on an IC. However, to send signals off the IC, such as to an output pin or output pad of the IC, may require significantly higher current.

In some examples an ECL logic gate may operate at value of approximately 4.0 mA. Therefore, the relatively small SCL logic gates presented in FIGS. 7-9 may not be able to drive a specified output, such as a 50Ω transmission line, without significant scaling in size. However, the circuits described in this disclosure may be scaled, for example, to about 20 times bigger and maintain the dynamic properties of the logic gate: rise time, fall time, and propagation delay and similar properties. In some examples, it may be advantageous to insert logic gates that are intermediate in size between the low-current internal SCL logic gates and the large high-current SCL pad driving buffers in order to minimize loading effects, which may reduce the dynamic performance.

Figure 10:
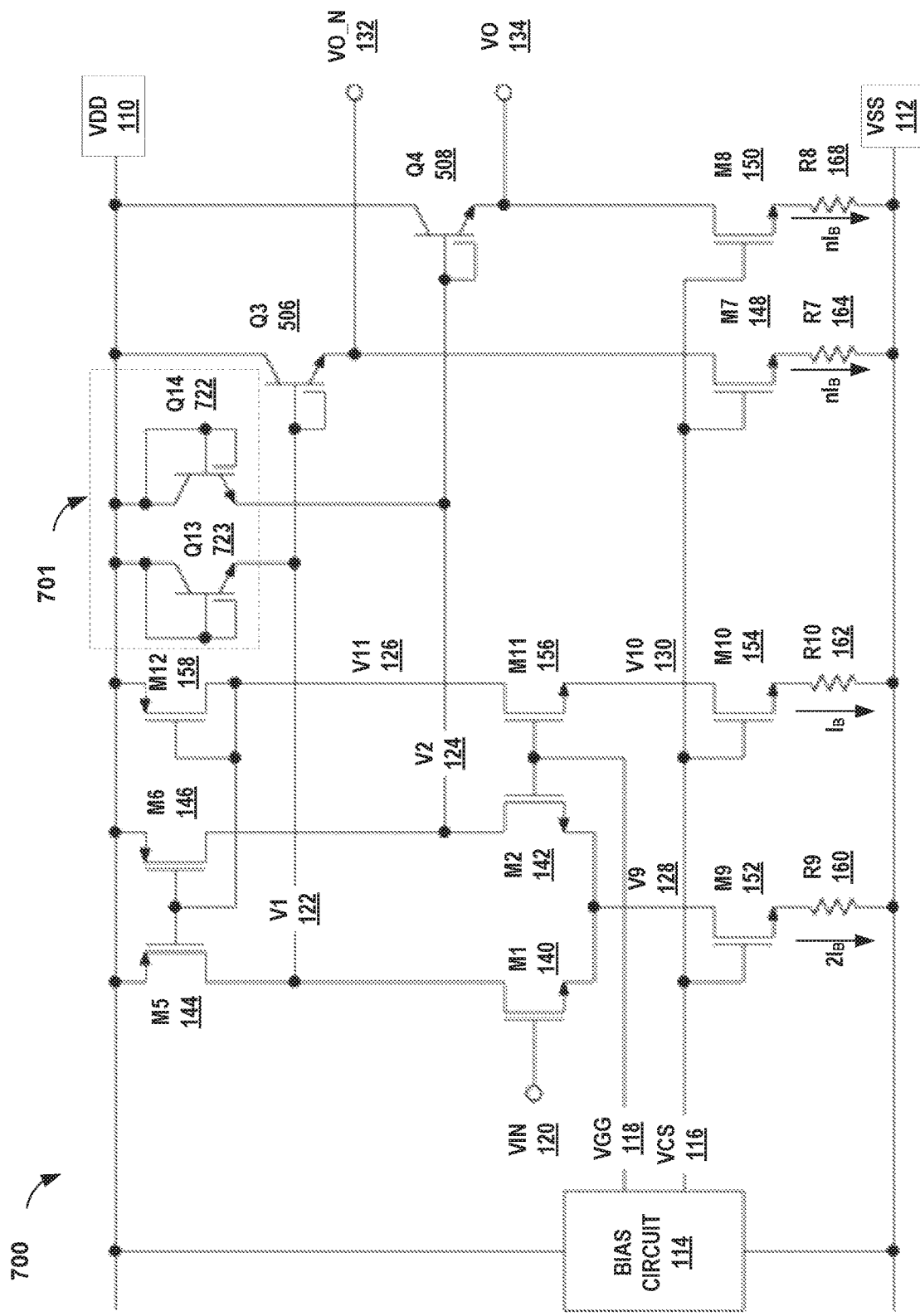
FIG. 10 is a schematic diagram illustrating a second example implementation of the SCL gate of this disclosure.

FIG. 10 is a schematic diagram illustrating a second example implementation of the SCL gate of this disclosure. In circuit 700, the voltage limiting devices (701) used to set the logic ZERO voltage level, $V_{OL}$, have been implemented using diode connected DT MOSFETS (aka, super beta bipolar transistors). All other functions and characteristics described above in relation to FIGS. 1-9 apply to circuit 700. For example, pull-up transistors M5 144 and M6 146, output transistors Q3 506 and Q4 508, bias circuit 114, current sinks M9 152, M10 154 and the other components of circuit 700 have the same functions and characteristics as described above in relation to FIGS. 1-9, unless otherwise noted.

As described above in relation to FIG. 1, voltage limiting devices 701 may be implemented by a variety of techniques. In the example of FIG. 700, the emitter of Q13 723 connects to node V1 122 and the emitter of Q14 722 connects to node V2 124. The base and collector of Q13 723 and the base and collector of Q14 722 connect to Vdd 110. Implementing voltage limiting devices 701 with DT NMOS may provide an advantage in that a DT NMOS may have the least capacitance for a given voltage drop, when compared to other implementations, and depending on the IC technology used. As described above in relation to FIG. 4, a reduced capacitance may improve gate propagation delay and deliver superior performance.

Figure 11:
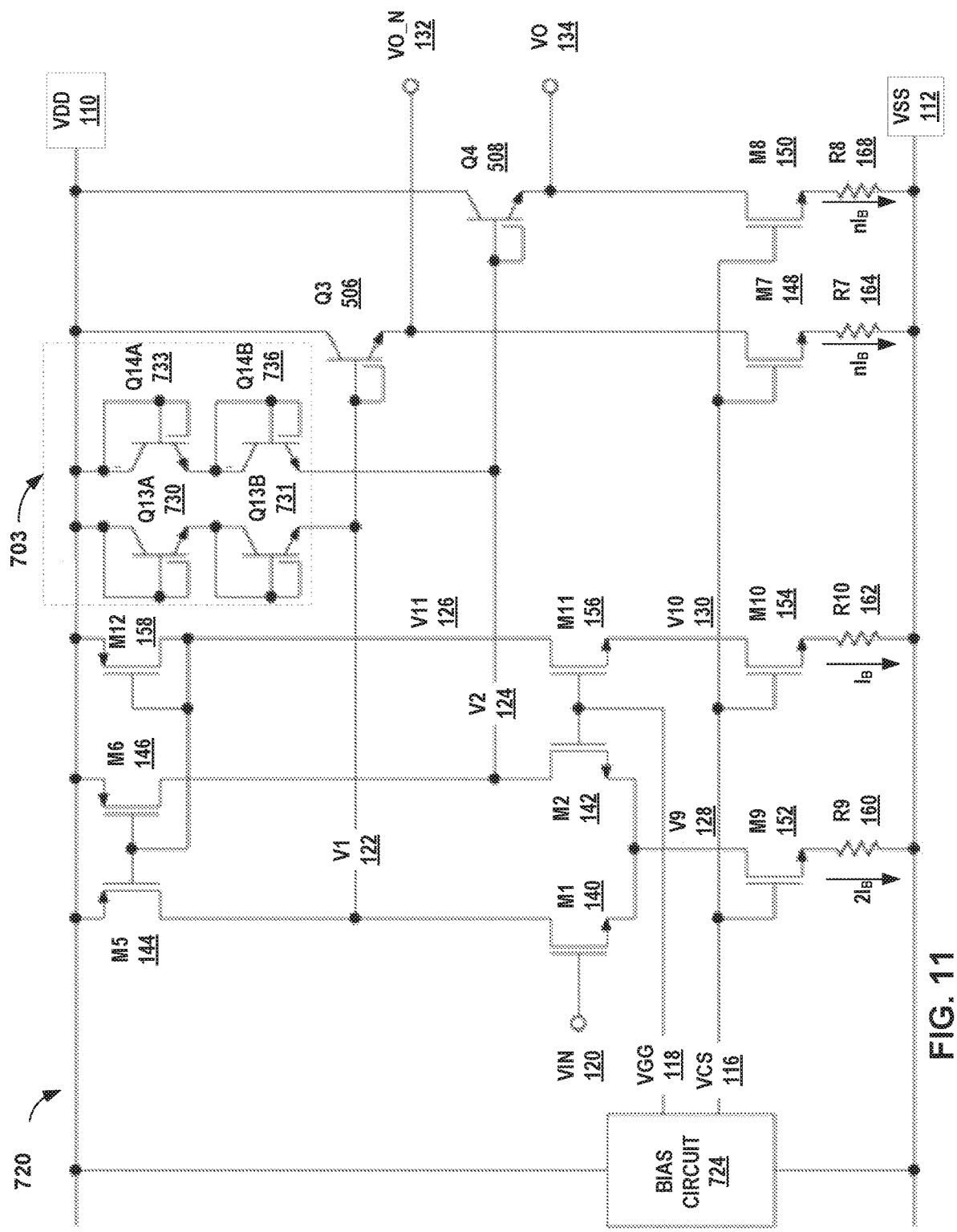
FIG. 11 is a schematic diagram illustrating a third example implementation of the SCL gate of this disclosure.

FIG. 11 is a schematic diagram illustrating a third example implementation of the SCL gate of this disclosure. In circuit 720, the voltage limiting devices (703) used to set the logic ZERO voltage level, $V_{OL}$, have each been implemented using two diode connected super beta BJTs in series. All other functions and characteristics described above in relation to FIGS. 1-9 apply to circuit 700. For example, pull-up transistors M5 144 and M6 146, output transistors Q3 506 and Q4 508, current sinks M9 152, M10 154 and the other components of circuit 700 have the same functions and characteristics as described above in relation to FIGS. 1-9, unless otherwise noted.

In the example of FIG. 720, the emitter of Q13A 730 connects to the base and collector of Q13B 731. The emitter of Q13B 720 connects to node V1 122. The emitter of Q14A 733 connects to the base and collector of Q14B 736. The emitter of Q14B 736 connects to node V2 124. The base and collector of Q13A 730 and the base and collector of Q14A 733 connect to Vdd 110.

Implementing voltage limiting devices 703 with a pair of DT NMOS transistors in series may have the effect of doubling the difference between the high $V_{OH}$ and low $V_{OL}$ logic levels. This configuration may reduce the performance of the logic gate by increasing the voltage difference Vdiff between $V_{OH}$ and low $V_{OL}$, as described above in relation to FIG. 4. However, a pair of DT NMOS transistors in series may have the advantage of reducing the complexity of the required bias circuit 724. The functions and outputs, Vcs 116 and Vgg 118 may be similar to those of bias circuit 114 described above in relation to FIGS. 1, 6 and 9. However, the configuration and arrangement of bias circuit 724 may differ from that of bias circuit 114.

Figure 12:
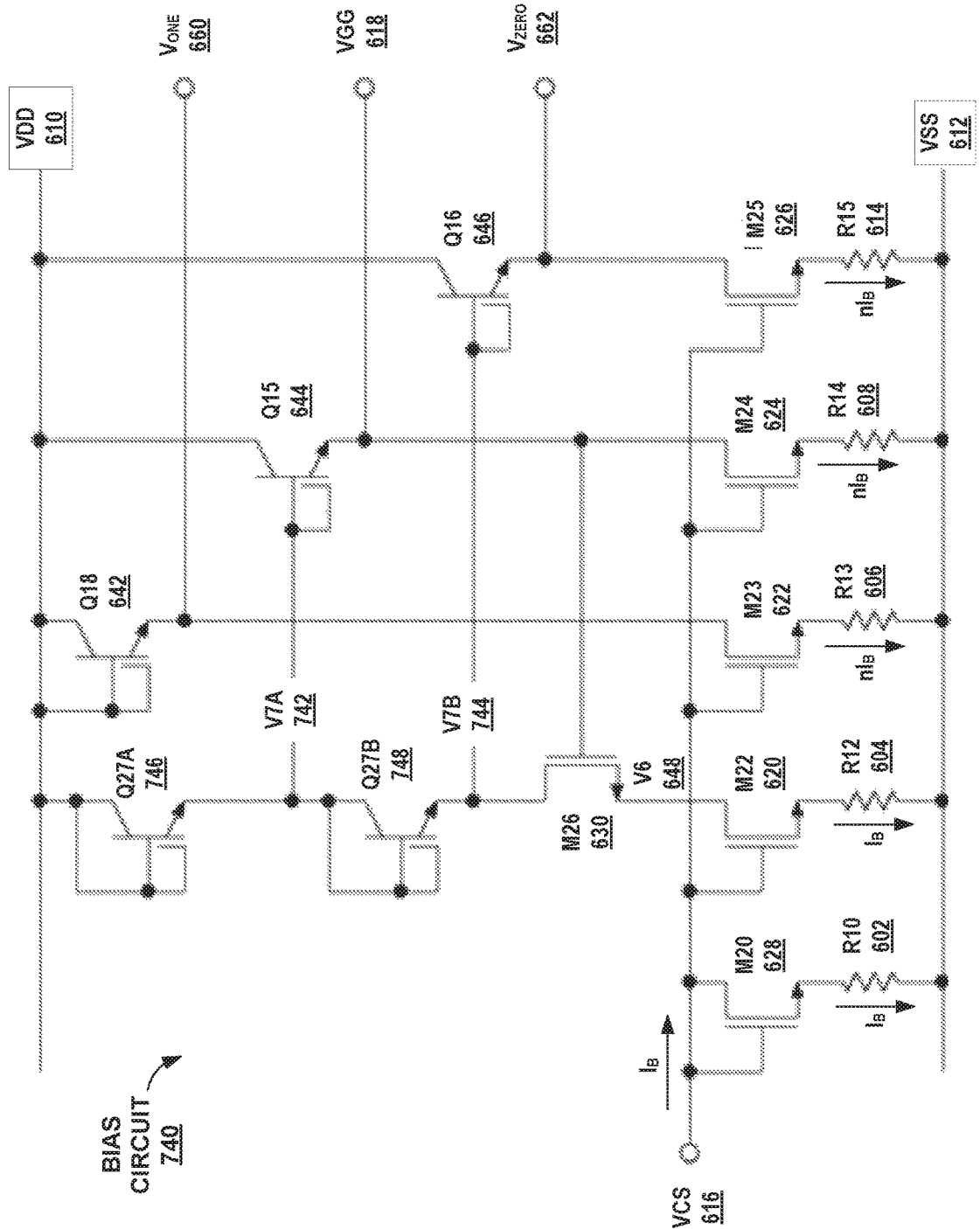
FIG. 12 is a schematic diagram illustrating an example implementation of a simplified bias circuit that may be used with the third example SCL gate of this disclosure.

FIG. 12 is a schematic diagram illustrating an example implementation of a simplified bias circuit that may be used with the third example SCL gate of this disclosure. Bias circuit 740 is an example of bias circuit 724 described above in relation to FIG. 11. Bias circuit 740 has a different arrangement but performs similar functions to bias circuit 114 described above in relation to FIGS. 1, 4 and 5 and bias circuit 600 described above in relation to FIG. 6.

As with circuit 600, Vcs 616 in FIG. 12 is both an input and an output, is an example of $V_{CS}$ 116 depicted in FIG. 11 and performs the same functions as $V_{CS}$ 116 described above in relation to FIG. 1. Like circuit 600, the voltage applied to the $V_{CS}$ terminal of FIG. 12, $V_{CS}$ 616, drives the bias current, $I_B$ through transistor M20 628 and resistor R10 602 as well as the remaining current sinks. The gates of NMOS transistors M20 628, M22 620, M23 622, M24 624, and M25 626 connect to Vcs 616. The drain of M20 628 also connects to Vcs 616.

In some examples, a constant current source from an external circuit may be applied to the Vcs 616 pin that causes a voltage to be developed across resistor R10 602 and diode-connected transistor M20 628. The developed voltage is then used to drive the gates of the source-follower transistors M22 620, M23 622, M24 624, and M25 626. The source-follower transistors M22-M25 in turn drive the voltages across R12 604, R13 606, R14 608 and R55 614 to be the same as the voltage across R10 602; thus, regulating the currents through the respective branches of bias circuit 740.

The source of NMOS transistor M26 630 connects to the drain of M22 620. As described above in relation to FIG. 6, transistor M26 630 in bias circuit 740 is configured to maintain the accuracy of the $I_B$ pull-down current, which may be affected by channel length modulation effects.

Transistors Q18 642, Q15 644 and Q16 646 form three emitter-follower circuits that are approximately the same. The collector of Q15 644 connects to Vdd 610 and the emitter of Q15 644 connects to the drain of current sink transistor M24 624 and provides the bias signal Vgg 618. Similarly, the collector of Q18 642 connects to Vdd 610 and the emitter of Q18 642 connects to the drain of current sink transistor M23 622 and drives the $V_{ONE}$ 660 output. The collector of super beta transistor Q16 646 connects to Vdd 610. The emitter of Q16 646 connects $V_{ZERO}$ 662 and to the drain of current sink transistor M25 626 and drives the $V_{ZERO}$ 662 output terminal.

Unlike bias circuit 600, bias circuit 740 has no amplifiers, such as AR1 640 described above in relation to FIG. 6. Instead a pair of diode connected DT MOSFETs in series connect Vdd 610 to the drain of M26 630. The base and collector of transistor Q27A 746 connect to Vdd 610. The emitter of Q27A 746 connects to the base and collector of transistor Q27B 748 at node V7A 742, which drives the base of output transistor Q15 644. The emitter of Q27A 746 connects the drain of M26 630 at node V7B 744, which drives the base of output transistor Q16 646. The simplified bias circuit of 740 may be desirable for some applications.

Figure 13:
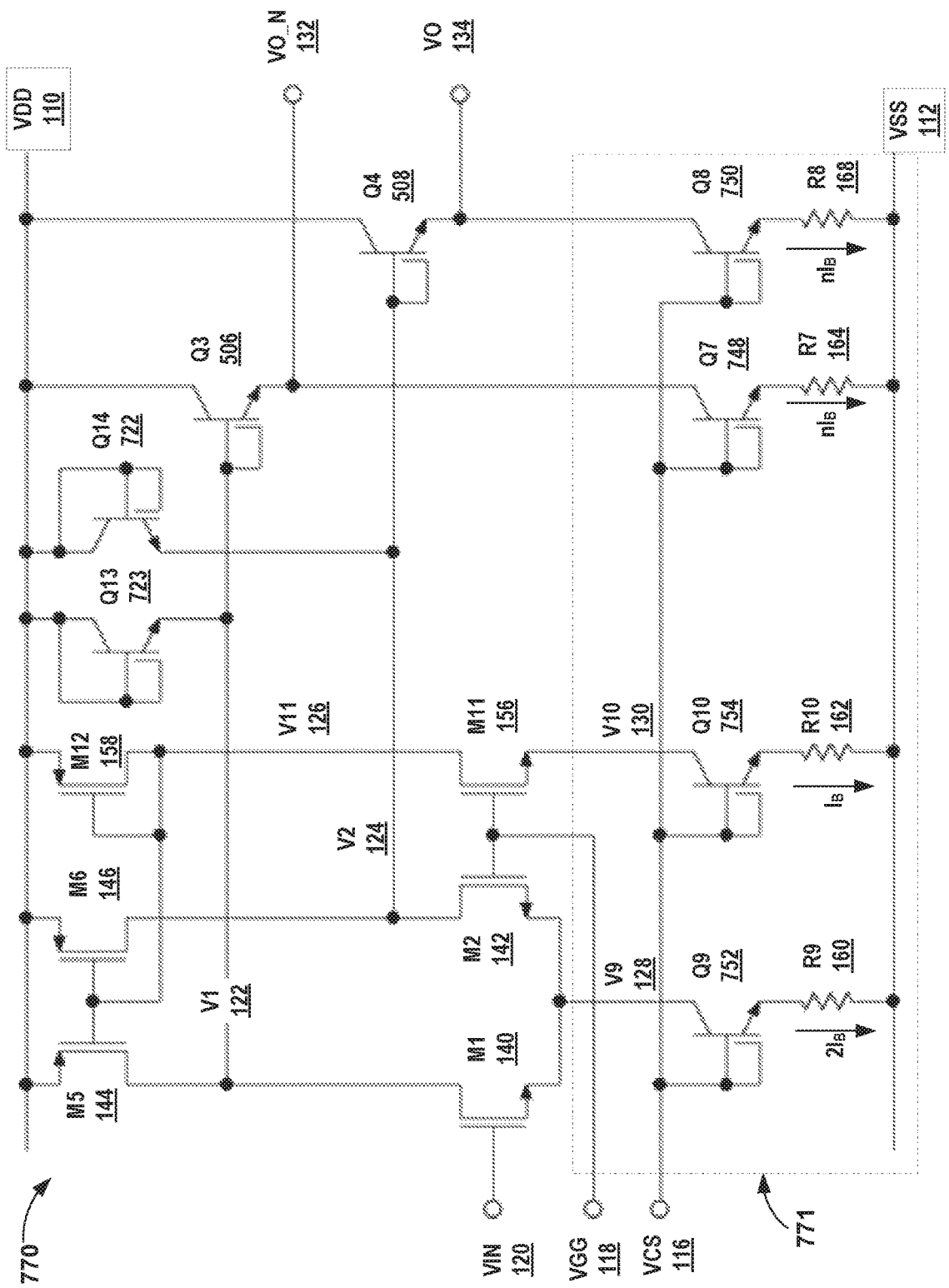
FIG. 13 is a schematic diagram illustrating a fourth example implementation of the SCL gate of this disclosure.

FIG. 13 is a schematic diagram illustrating a fourth example implementation of the SCL gate of this disclosure. In circuit 770, the current sink circuits (771) are implemented with emitter-degeneration current sink circuits instead of the source-degeneration current sink circuits depicted in circuits 100, 400 and 500. In other words, NMOS transistors M7 148-M10 154 are replaced with "super-Beta" or "DT NMOS" transistors Q7 748-Q10 754. Circuit 770 may use a different configuration for a bias circuit than bias circuit 114 and 600 described above in relation to FIGS. 1 and 6. However, each of transistors Q9, 752, Q10 754, Q7 748 and Q8 750 perform the same functions as M9 152, M10 154, M7 148 and M8 150 as described above in relation to FIG. 1.

Similar to circuits 100, 400 and 500, for circuit 770 Vcs 116 also drives the bases of each of Q9 752, Q10 754, Q7 748 and Q8 750. The collector of Q9 752 connects to the sources of M1 140 and M2 142. The emitter of Q9 752 connects to Vss 112 through resistor R9 160, which carries the tail current $I_{R9}$, as described above in relation to FIGS. 1, 4 and 5. The collector of Q10 754 connects to the source of M11 156. The emitter of Q10 754 connects to Vss 112 through resistor R10 162. The collector of Q7 748 connects to the emitter of Q3 506. The emitter of Q7 748 connects to Vss 112 through resistor R7 164. The collector of Q8 750 connects to the emitter of Q4 508. The emitter of Q8 750 connects to Vss 112 through resistor R8 168.

For a given value of bias current, $I_B$, circuit 770 may have a lower value of Vcs 116 than, for example, the circuit as simulated in FIG. 8. Therefore, the point (709 of FIG. 8) at which Vcs 716 and Vgg 718 are equal may occur at a higher value of $I_B$ than, for example for circuits 100, 400 and 500. A higher value of $I_B$ may permit a higher performance of the SCL gate of circuit 770, for a given power supply voltage, Vdd 110. The disadvantage of the configuration of circuit 770 is that the Vcs 116 input pin for each logic gate now may now consume DC current, e.g. through the base connections of Q7 748-Q10 754. While this current may be much less than what would be required to drive the base terminals of a standard BJT, the current is still non-zero. In some examples it may be desirable to add an additional amplifier the bias cell for circuit 770 to buffer the Vcs 116 output from the bias cell, for example if the bias circuit will drive more than two or three logic gates.

The example of FIG. 13 may be limited for some high performance applications. In a mode in which the voltage at the output of any SCL logic gate output goes below the Vcs voltage, it is possible that a large base-to-collector current may flow, which will load down the bias circuit. Loading the bias circuit may cause the magnitude of Vcs 716 to fall below a minimum magnitude for circuit performance. In addition to distributing a low magnitude Vcs bias to any other SCL logic gates connected to the same bias circuit, a low magnitude Vcs may impact the Vgg voltage (aka Vbb), which may increase. The net result is that the logic gates connected to a particular bias circuit may function improperly until the offending output node increases above the Vcs voltage.

Figure 14:
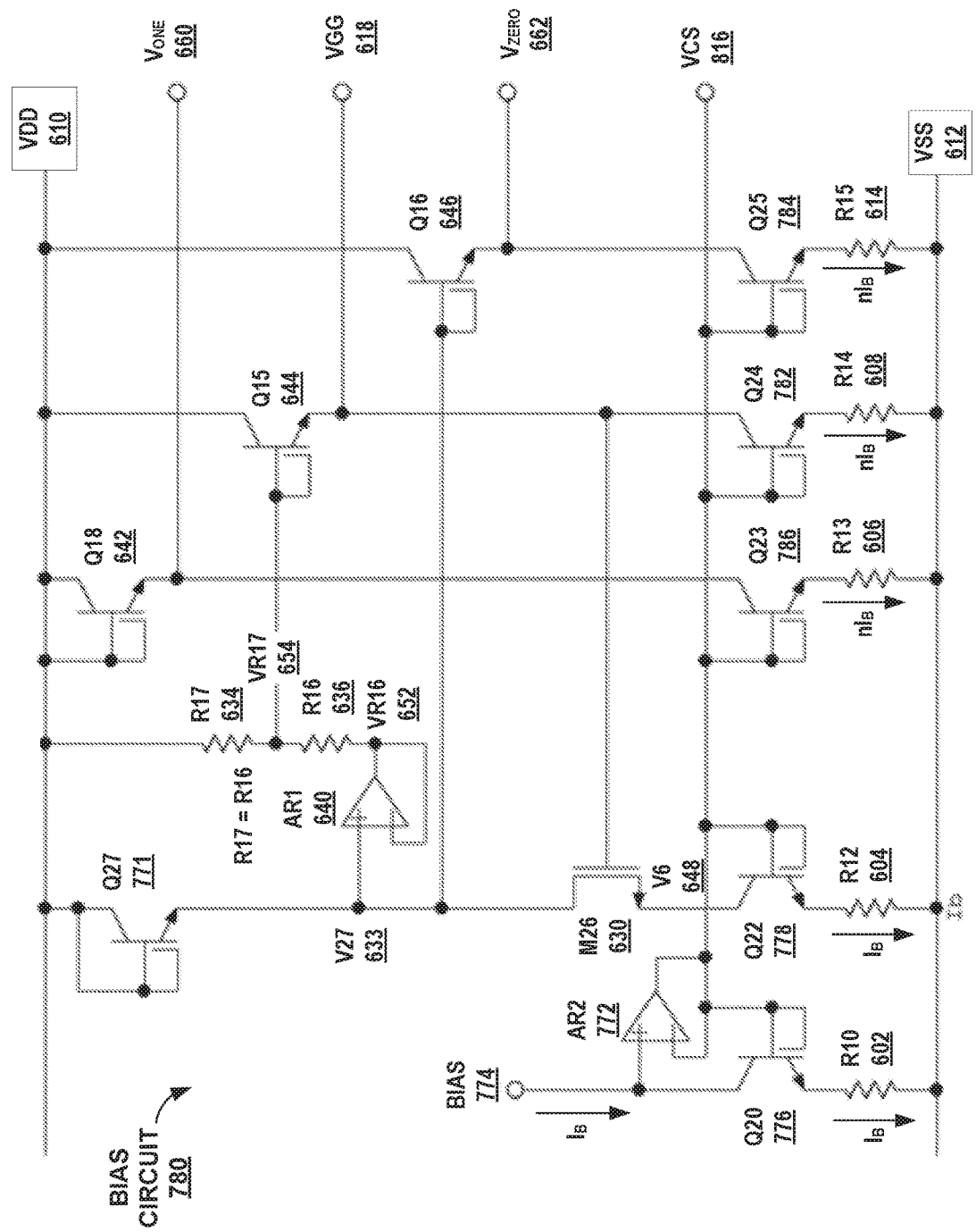
FIG. 14 is a schematic diagram illustrating an example implementation of a bias circuit that may be used with the fourth example SCL gate of this disclosure.

FIG. 14 is a schematic diagram illustrating an example implementation of a bias circuit that may be used with the fourth example SCL gate of this disclosure. As described above in relation to FIG. 13, bias circuit 780 includes a second buffer amplifier AR2 772 coupled between input terminal, bias 774, and each respective base terminal for the one or more emitter-degeneration current sink circuits.

Bias circuit 780 is similar to bias circuit 600, described above in relation to FIG. 6. One difference in bias circuit 780 is that the source-follower transistors M20 628-M25 626 of FIG. 6 are instead implemented with emitter-follower transistors Q20 776-Q25 784. Furthermore, the diode-connected PMOS FET, M27 632 of circuit 600, is replaced with a diode connected super beta transistor Q27 771. Another difference is the Vcs 816 terminal of bias circuit 780 is not both an input and an output as is Vcs 616 of bias circuit 600. Vcs 816 in bias circuit 780 is strictly just an output. Bias circuit 780 includes a new input terminal, bias 774. In some examples, the bias 774 terminal may be driven with a constant current source of sufficient magnitude to meet the performance requirements of the application circuit. In other examples, such as when low current consumption is less of a concern for a particular application, bias 774 may also be shorted to the Vgg 618. Shorting bias 774 to Vgg 618 may provide high performance (e.g. reduced gate propagation and high toggle frequency) at the cost of higher current consumption. A second amplifier, AR2 772, may allow bias circuit 780 to drive a large number of logic gates.

As described above in relation to FIGS. 6 and 12, transistors Q18 642, Q15 644 and Q16 646 form three emitter-follower circuits that are approximately the same. The collector of Q15 644 connects to Vdd 610 and the emitter of Q15 644 connects to the drain of current sink transistor Q24 782 and provides the bias signal Vgg 618. Similarly, the collector of Q18 642 connects to Vdd 610 and the emitter of Q18 642 connects to the drain of current sink transistor Q23 786 and drives the $V_{ONE}$ 660 output terminal. The collector of super beta transistor Q16 646 connects to Vdd 610. The emitter of Q16 646 connects $V_{ZERO}$ 662 and to the drain of current sink transistor Q25 784 and drives the $V_{ZERO}$ 662 output terminal.

The emitter of Q16 646 connects to the collector of Q25 784. The emitter of Q25 784 connects to Vss 612 through resistor R15 614. The emitter of Q15 644 connects to the collector of Q24 782. The emitter of Q24 782 connects to Vss 612 through resistor R14 608. The emitter of Q18 642 connects to the collector of Q23 786. The emitter of Q23 786 connects to Vss 612 through resistor R13 606.

Q22 778 acts as the current sink for the circuit leg including M26 630 and Q27 771. The emitter of Q22 connects to the source of M26 630 at node V6 648. The emitter of Q22 778 connects to Vss 612 through R12 604.

In the example of bias circuit 780, the emitter of Q20 776 receives the bias current from input terminal, bias 774. The emitter of Q20 776 connects to Vss 612 through R10 602. The base of Q20 770 connects to the output of AR2 772.

As with circuit 600, Vgg 618 is configured to output a voltage with a magnitude of approximately half the magnitude of the voltage difference between $V_{ONE}$ 660 and $V_{ZERO}$ 662. The gate of Q15 644 is connected to node VR17 654, between resistor R17 634 and R16 636. In the example of bias circuit 780, R16 636 and R17 634 form a resistor divider in which the value of R16 636 is configured to be approximately equal to R17 634, within manufacturing and measurement tolerances.

The base and collector of Q27 771 connects to Vdd 610. At node V27 633, the emitter of Q27 771 connects to the drain of M26 630, the non-inverting input of unity gain buffer AR1 640 and the base of super beta transistor Q16 646, which drives the $V_{ZERO}$ 662 output terminal. Both the inverting input and the output of AR1 640 connect to voltage node VR16 652, which connects to a first terminal of resistor R16 636. The opposite terminal of R16 636 connects to Vdd 610 through resistor R17 634. With one end of the resistor divider connected through unity gain buffer AR1 640 to node V27 633 and the opposite end of the resistor divider, i.e. the opposite terminal of R17 634 connected to Vdd 610, the magnitude of voltage node VR17 654 is configured to be approximately half of the voltage difference between Vdd 610 and V27 633, the voltage used to drive Q16 646. Therefore, node VR17 654 causes transistor Q15 644 to drive the Vgg 618 output to a logic threshold level (aka a voltage magnitude) that is approximately half-way between the magnitude of $V_{ONE}$ 660 and $V_{ZERO}$ 662.

Figure 15:
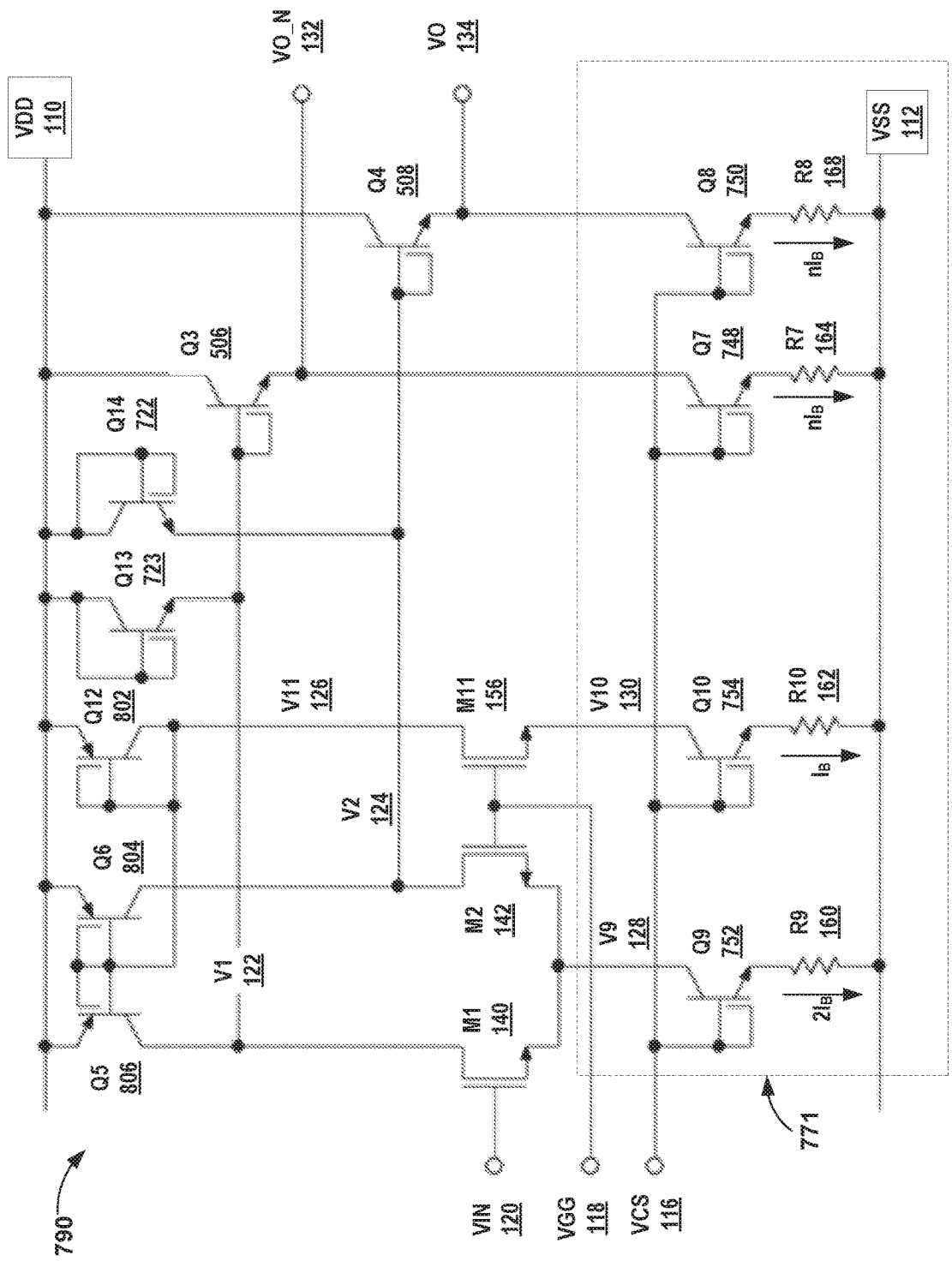
FIG. 15 is a schematic diagram illustrating a fifth example implementation of the SCL gate of this disclosure.

FIG. 15 is a schematic diagram illustrating a fifth example implementation of the SCL gate of this disclosure. The SCL logic gate variation of circuit 790 may use the same bias cell circuit 780 described above in relation to FIG. 14 because of the use of the super-Beta NPN transistors used as current sinks 771, described above in relation to FIG. 13.

In the example of circuit 790 the PMOS current mirrors M5 144, M6 146, and M12 158 that act as pull-up transistors described above in relation to FIGS. FIGS. 4, 10, 11, and 13, are replaced with super-Beta PNP transistors (aka DT PMOS transistors) Q5 806, Q6 804, and Q12 802. Transistors Q5 806, Q6 804, and Q12 802 may remain in a current limiting, non-ohmic, region over a wider range of collector-to-emitter voltages when compared to the range of drain-source voltages of M5 144, M6 146, and M12 158. However, the configuration of circuit 790 may not have a significant impact on performance when compared to circuits 400, 700, 720 and 770 described above in relation to FIGS. FIGS. 4, 10, 11, and 13. Some factors that may affect the performance difference of circuit 790 may include the impact of the small base currents for the super-Beta PNP transistors compared to any gate current for the PMOS current mirrors M5 144, M6 146, and M12 158, which may have an insignificant effect on performance. Another difference may include a base charge storage effects of the super-Beta PNP transistors compared to the PMOS current mirrors.

In circuit 790, the emitter of Q12 802 connects to Vdd 110. The collector and base of Q12 802 connects to the drain of M11 156 at node V11 126 and to the bases of transistors Q5 806 and Q6 804. The emitter of Q5 806 and the emitter of Q6 804 connects to Vdd 110. The collector of Q5 806 connects to the drain of input transistor M1 140 at node V1 122. The collector of Q6 804 connects to the drain of transistor M2 142 at node V2 124. As described above in relation to FIGS. 1, 4, 5 and 13, the voltage at nodes V1 122 and V2 124 connect to the control terminals of the output transistors and therefore control the voltage level of the logical HIGH, Vox, and logical LOW, $V_{OL}$. In the example of circuit 790 the control terminal is the base of output transistor Q3 506 and the base of output transistor Q4 508, the same as with FIGS. 5 and 13. The pull-up transistors Q5 806 and Q6 804 perform the function of pulling nodes V1 122 and V2 124 up to Vdd 110. Transistors, Q5 806 and Q6 804, therefore set logic HIGH voltage level, $V_{OH}$, at outputs VO_N 132 and VO 134. The remaining nodes and components of circuit 790, e.g. Vin 120, M1 140, M2 142, M11 156, and outputs VO_N 132 and VO 134, have the same characteristics and functions as described above in relation to FIGS. 1, 4, 5 and 13.

Figure 16:
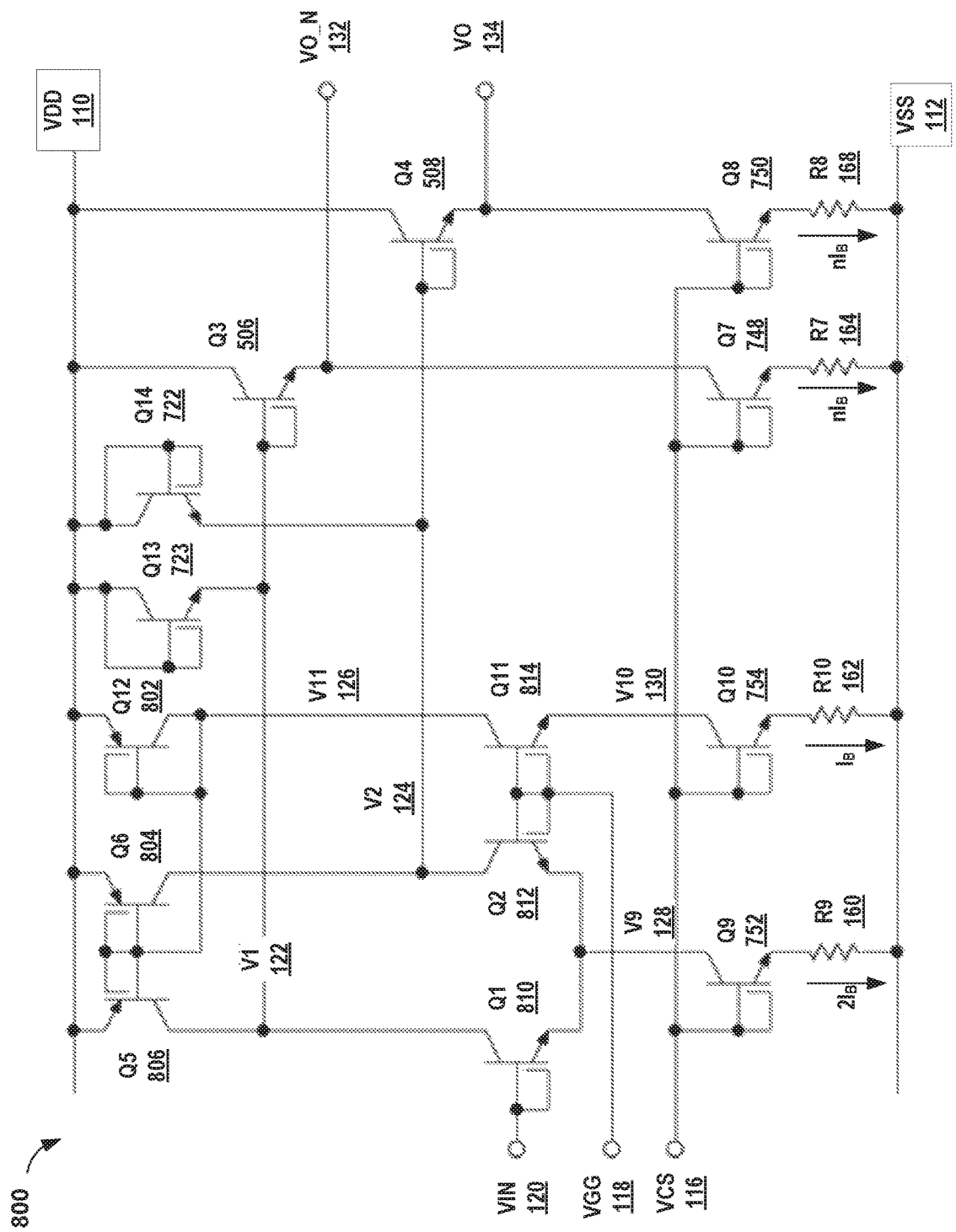
FIG. 16 is a schematic diagram illustrating a sixth example implementation of the SCL gate of this disclosure.

FIG. 16 is a schematic diagram illustrating a sixth example implementation of the SCL gate of this disclosure. In the example of circuit 800, NMOS input transistors, M1 140 and M2 142, along with the matching transistor M11 156, described above in relation to FIGS. 1, 4 and 5 are all replaced with super-Beta NPN transistors. Unless otherwise noted, the remaining nodes and components of circuit 790, e.g. Vin 120, Q13 723, Q14 722, the tail current through R9 160, and outputs VO_N 132 and VO 134, have the same characteristics and functions as described above in relation to FIGS. 1, 4, 5, 10 and 13.

In circuit 800, the collector of Q1 810 connects to the collector of Q5 806 at node V1 122. The collector of Q2 812 connects to the collector of Q6 804 at node V2 124. The collector of Q11 814 connects to the collector and base of Q12 802. In circuit 800, Q11 814 is configured to help minimize current mismatches between transistors Q9 752 and Q10 754 as described above in relation to transistor M11 156 in circuit 100 depicted in FIG. 1.

Transistors Q1 810 and Q2 812 perform the same functions as described above in relation to FIGS. 1 and 8. Thus, when Vin 120 is at a logic HIGH, then Q1 810 is ON and Q2 812 is OFF. Thus, when Vin 120 is HIGH, a current with magnitude $I_B$ flows through Q5 806, a current of approximately $I_B$ flows through Q13 723, and a current 2×$I_B$ flows through Q1 810 and Q9 752. When the input voltage signal to Vin 120 is at a logic LOW, then Q1 810 is OFF and Q2 812 is ON. Thus, when Vin 120 is LOW, a current with magnitude of approximately $I_B$ flows through Q6 146, a current with magnitude of approximately $I_B$ flows through Q14 722, and a current 2×$I_B$ flows through Q2 812 and Q9 752.

Factors that may impact performance for the arrangement of circuit 800 may include the higher transconductance for transistors Q1 810, Q2 812 and Q 11 814 compared to the NMOS transistors M1 140, M2 142, and M11 156 described above in relation to FIG. 1. Another factor is transistors Q1 810, Q2 812 and Q 11 814 may also have higher capacitance at their collectors compared to the NMOS transistors M1 140, M2 142, and M11 156.

Figure 17:
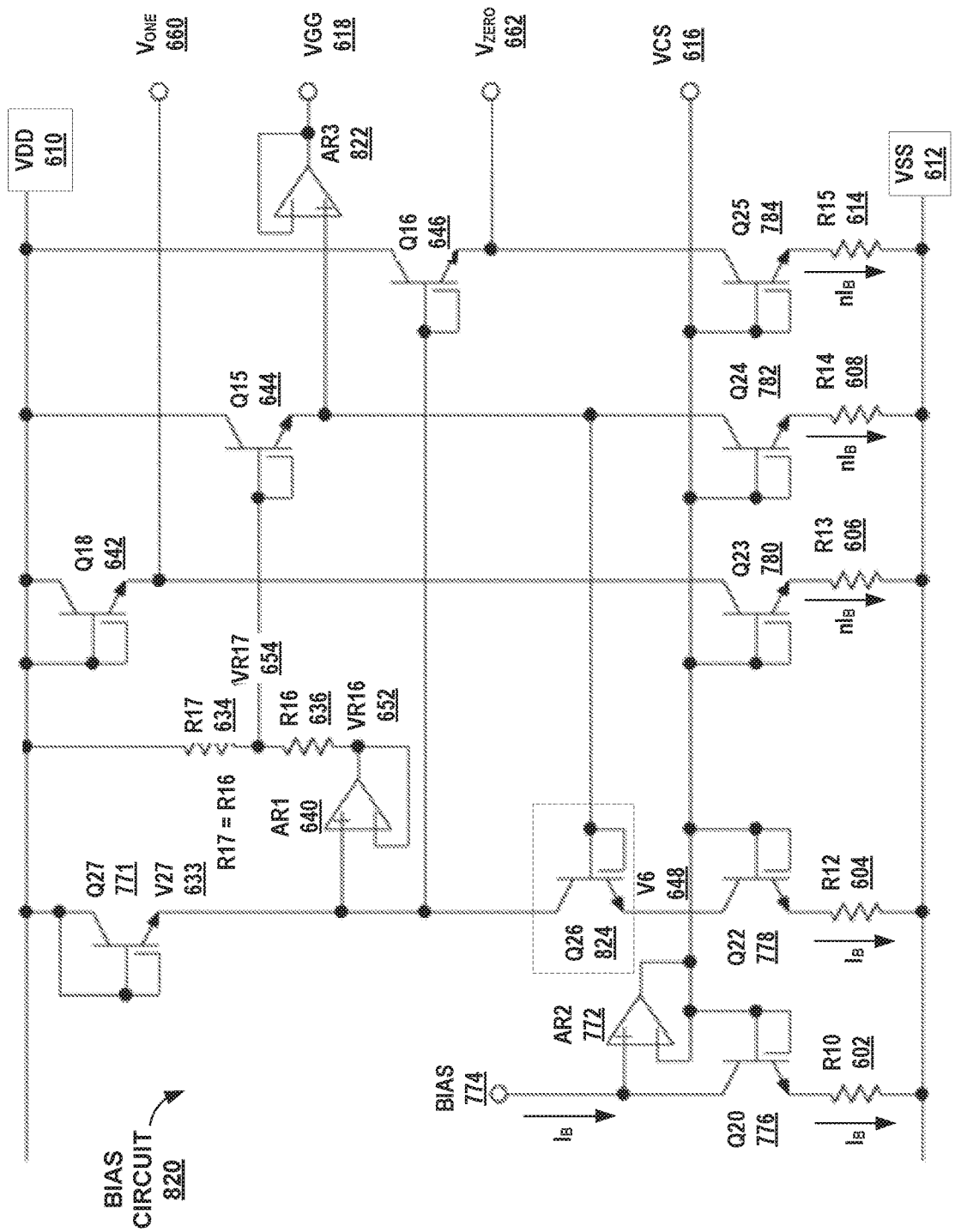
FIG. 17 is a schematic diagram illustrating an example implementation of a bias circuit that may be used with the sixth example SCL gate of this disclosure.

FIG. 17 is a schematic diagram illustrating an example implementation of a bias circuit that may be used with the sixth example SCL gate of this disclosure. It may be desirable to use bias circuit 820 of FIG. 17 for circuit 800 described above in relation to FIG. 16.

Bias circuit 820 of FIG. 17 is similar to bias circuit 780 described above in relation to FIG. 14. One difference between bias circuit 820 and bias circuit 780 is that in bias circuit 820, super-Beta NPN transistor Q26 824 performs the functions that were performed by NMOS transistor M26 630 in circuit 780. In circuit 820, the collector of Q26 824 connects to the emitter of Q27 771, the non-inverting input of AR1 640 and the base of Q16 646 at node V27 633. the emitter of Q26 824 connects to the collector of Q22 778 at node V6 648. The base of Q26 824 connects to the emitter of Q24 782 and the emitter of Q15 644.

A second difference is bias circuit 820 includes a third amplifier, AR3 822, to buffer output Vgg 618. Amplifier AR3 822 is a unity gain buffer that may be used with SCL gates that have an arrangement such as the arrangement of circuit 800 of FIG. 16. Logic gates similar to circuit 800 may consume small DC currents. In examples in which bias circuit 820 drives only a small number of logic gates, then buffer AR3 822 may be omitted. In examples in which bias circuit 820 drives a large number of logic gates, AR3 822 may be desirable to minimize DC shifts in Vgg 618, which may degrade noise margin. For similar reasons, in some examples, it may be desirable to include a buffer similar to AR3 822 on outputs $V_{ONE}$ 660 and $V_{ZERO}$ 622. In other examples, in applications in which outputs $V_{ONE}$ 660 and $V_{ZERO}$ 622 are not needed to bias any unused SCL inputs in a mixed-mode IC, outputs $V_{ONE}$ 660 and $V_{ZERO}$ 622 may be omitted altogether.

When used to bias one or more logic gates such as circuit 800, all of the MOS transistors of the SCL gate described above in relation to FIGS. 1, 4 and 5 have been replaced with super-Beta bi-polar transistors. Therefore, the combination of circuits 820 and 800 may appear to be emitter-coupled logic, ECL. However, the combination of circuits 820 and 800 differ from conventional ECL for the following reasons:
- The logic input (base) currents are orders of magnitude smaller when compared to an ECL circuit.
- The performance of these super-Beta NPN transistors (aka DT MOSFET) transistors scales with the minimum critical dimension of the technology used to implement an IC.
- Current mirrors and voltage-limiting "diodes." i.e. diode connected transistors, such as Q5 806 and Q6 804 depicted in FIG. 16, perform the functions of pull-up resistors used by ECL circuits
- The performance of the logic gate of circuit 800 depicted in FIG. 16, may be programmed to a desired level by controlling the input current, IB, to bias cell 820.

Figure 18:
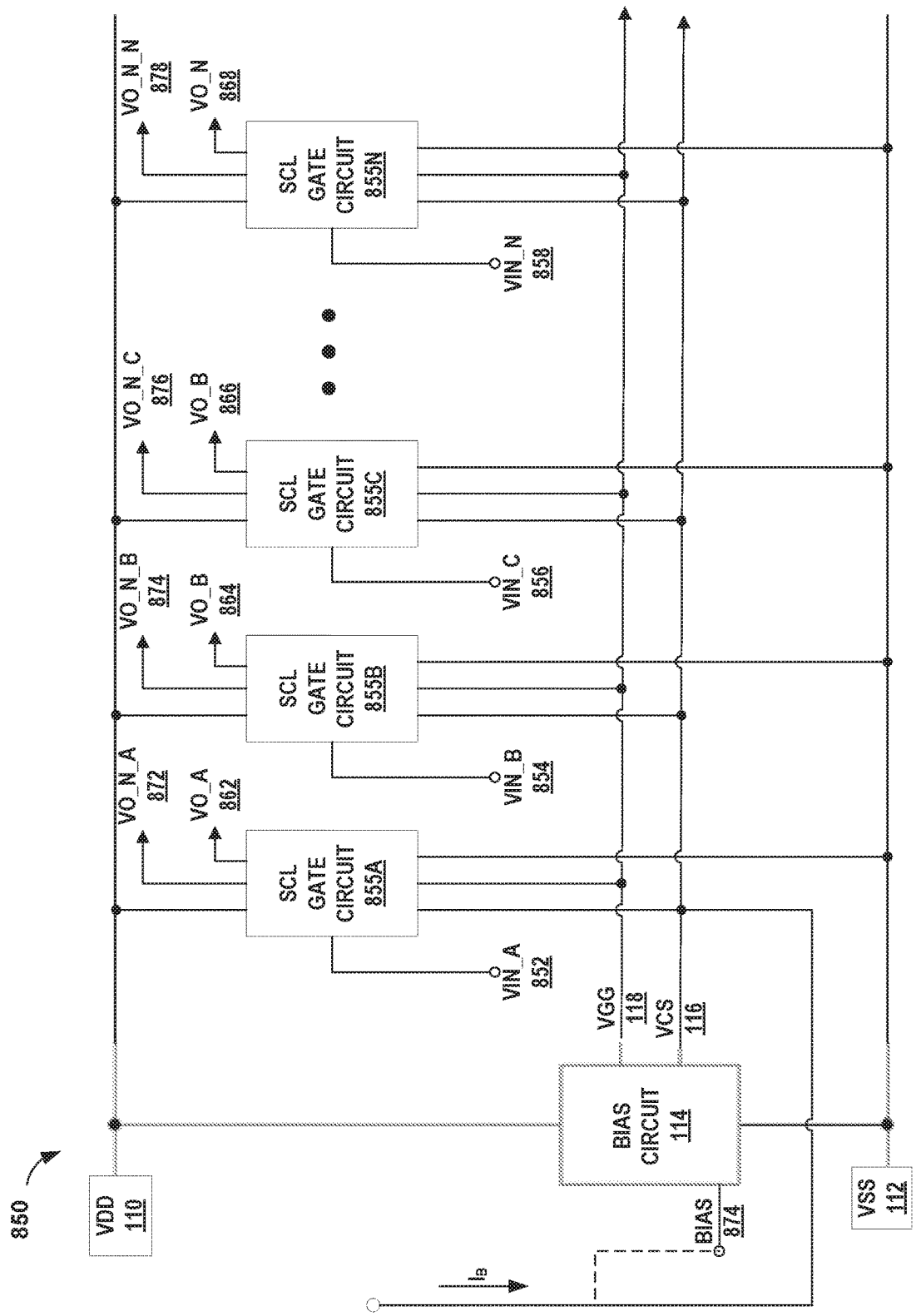
FIG. 18 is block diagram of an example system of SCL gate circuits biased by a single bias circuit according to one or more techniques of this disclosure.

FIG. 18 is block diagram of an example system of SCL gate circuits biased by a single bias circuit according to one or more techniques of this disclosure. System 850 is an example of circuit 100 described above in relation to FIG. 1, with more than one logic gate circuit connected to bias circuit 114. Bias circuit 114, Vdd 110 and Vss 112 in FIG. 18 are examples of respectively, bias circuit 114, Vdd 110 and Vss 112 described above in relation to FIG. 1. Therefore, the functions and characteristics of bias circuit 114, Vdd 110 and Vss 112 are the same as the functions and characteristics described above in relation to FIG. 1. Similarly, SCL gate circuit 855A, SCL gate circuit 855B, SCL gate circuit 855C and gate circuit 855N are examples of the logic gates described above in relation to FIGS. 1, 4, 5, 10, 11, 12, 13, 15, and 16. Therefore the functions and characteristics are the same as the functions and characteristics described for the buffer-inverter logic gates above in relation to FIGS. 14, 5, 10, 11, 12, 13, 15, and 16.

In the example of system 850, bias circuit 114 is connected to power supply Vdd 110 and to power supply return Vss 112. In some examples, bias circuit 114 may receive Vcs 116 as an input and provide Vcs 116 as an output to each SCL gate circuit 855A-855N. In other examples, bias circuit 114 may receive the bias current at BIAS input 874 as described above in relation to FIGS. 14 and 17. Bias circuit 114 may also output Vgg 118 to each SCL gate circuit 855A-855N.

Each SCL gate 855A-855N connects to Vdd 110 and Vss 112 and each has a respective input terminal Vin_A 852, Vin_B 854, Vin_C 856, and Vin N 858. In the example of the buffer-inverter circuits described above in relation to FIGS. 1, 4, 5, 10, 11, 12, 13, 15, and 16, each SCL gate 855A-855N has a respective output terminal, VO_A 862-VO_N 868, and complementary output terminal VO_N_A 872-VO_N_N 878, In other examples, a logic gate, such as gate circuit 855N could be implemented as an ECL circuit or an SCL-to-ECL converter circuit, as described above in relation to FIG. 7. Also, as described above in relation to FIG. 1, logic gate circuits 855A-855N may be implemented as any one or more of an OR gate, AND gate, XOR gate, multiplexer, latch, flip-flop, and other complex logic functions. In some examples, any one or more SCL gate circuits may be implemented as part of a mixed-mode or other type of IC. In the example of a logic function other than the buffer-inverter, for example of circuit 100 depicted in FIG. 1, the logic gate may have different input signals and different output signals than shown in FIG. 18.

Figure 19:
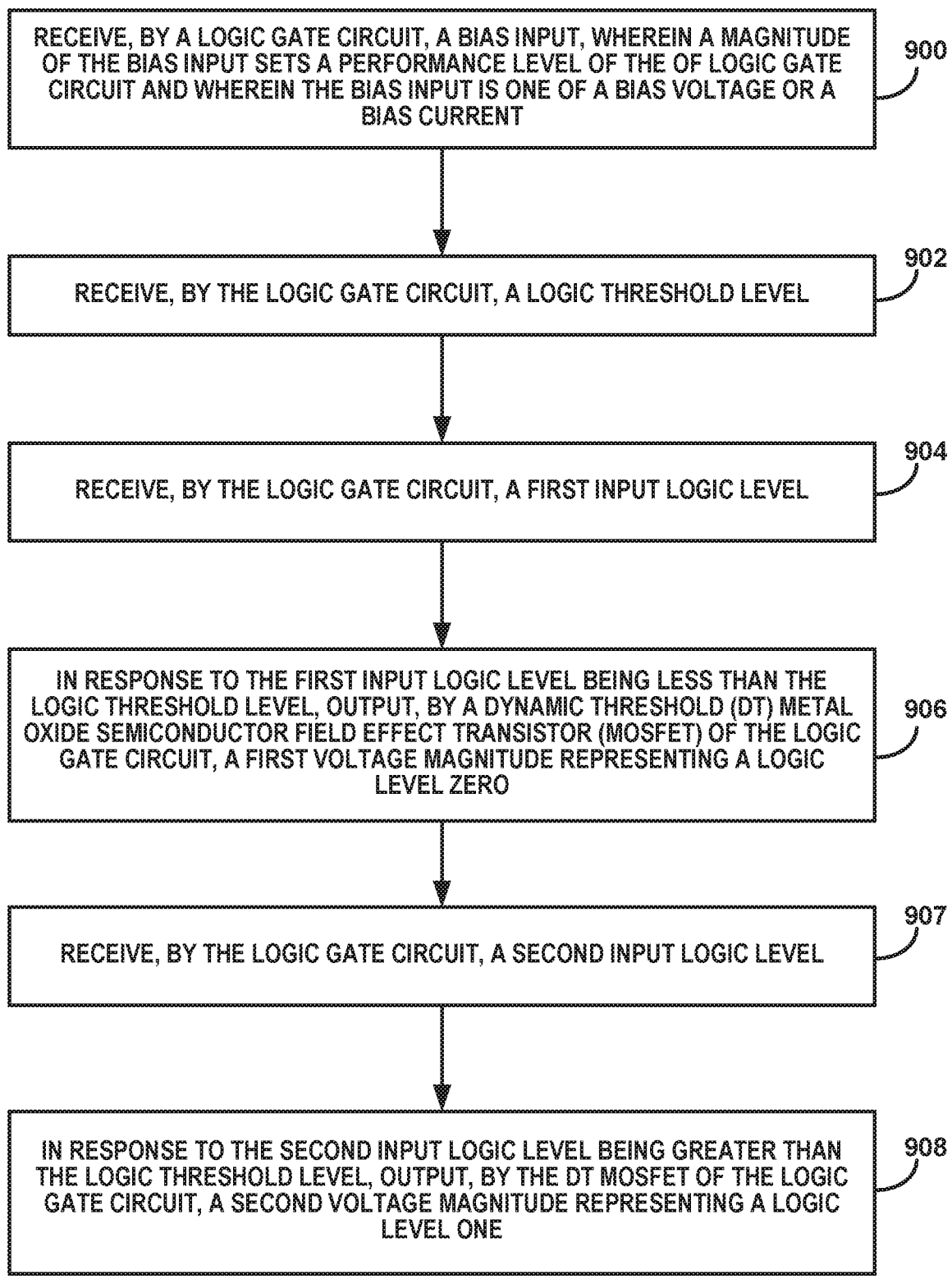
FIG. 19 is a flow diagram illustrating an example operation of an SCL gate of this disclosure.

FIG. 19 is a flow diagram illustrating an example operation of an SCL gate of this disclosure. The blocks of FIG. 19 will be described in terms of circuit 500 depicted in FIG. 5, bias circuit 600 depicted in FIG. 6, and bias circuit 780 depicted in FIG. 14, unless otherwise noted.

Logic gate circuit 500 may receive a bias input, Vcs 116, from bias circuit 114 (900). The magnitude of Vcs 116 sets a bias current $I_B$ in the current sink circuits that include transistors M7 148-M10 154. As described above in relation to FIGS. 7, 8 and 9, the magnitude of bias current $I_B$ may set the performance level of the logic gate circuit. One measure of performance may include toggle frequency of a flip-flop circuit (not shown in FIG. 5) that is implemented using the SCL techniques of this disclosure used to implement buffer-inverter circuits as depicted, for example, in FIGS. 1, 4 and 5. FIG. 7 describes how a desired circuit performance may be set based on selecting a magnitude of bias current. Adjusting bias current may tune the desired performance to the level needed for a particular application. In this manner, a particular application may reduce the power consumption of a circuit that includes the SCL circuit of this disclosure by tuning the performance only to the performance needed for the particular application. Moreover, the reduced noise from SCL based logic gates when compared to CMOS based logic gates may make SCL based logic gates desirable for mixed-mode IC applications.

In some examples, bias circuit 114 may be considered to be a part of a logic gate circuit. As described above in relation to FIGS. 14 and 17, the bias input 774 to bias circuits 780 and 820 is a bias current rather than a bias voltage. In other examples, the bias circuit may be considered to be separate from the logic gate circuit.

In the example of FIG. 5, circuit 500 receives a logic threshold level, Vgg 118 at the gates of M2 142 and M11 156 (902). Because the dimensions of M27 632 in bias circuit 600 approximately match the dimensions of voltage limiting transistors M13 402 and M14 404 in the logic gate circuit, and Vgg 118 controls transistors M2 142 and M11 156, the magnitude of Vgg 118 sets the threshold between a logical ONE (HIGH) and a logical ZERO (LOW). Bias circuit 600 may also be referred to as bias cell 600 in this disclosure.

In the buffer-inverter logic gate example of circuit 500, the circuit receives an input logic level, i.e. a digital input, at Vin 120 (904). As described above in relation to FIG. 1, other examples of logic gates implemented using the SCL techniques of this disclosure may have different inputs and different outputs than for the buffer-inverter logic gate example of circuit 500. For example, an AND gate may have two or more inputs and the output of the AND gate will be a multiplication of the two or more inputs (not shown in FIG. 19). A T-type flip-flop may include a toggle input (T), clock input and one or more outputs, e.g. Q and Q' (not shown in FIG. 19).

In response to the input logic level at Vin 120 being less than the logic threshold level Vgg 118, outputting, by DT MOSFET output transistor Q4 508, a voltage magnitude representing a logic level ZERO at VO 134 (906). Because VO_N 132 is complementary to VO 134, at the same time, VO_N 132 outputs a logic level ONE. Voltage limiting elements, M13 402 and M14 404 are coupled between supply voltage Vdd 110 and the gate of output transistor Q3

506 and Q4 508 respectively. The voltage limiting element is configured to set the voltage magnitude, $V_{OL}$, representing the logic level ZERO.

The circuit may receive a second input logic level at Vin 120 (907). In response to this second input logic level at Vin 120 being greater than the logic threshold level, Vgg 118, outputting, by output transistor Q4 508, a second voltage magnitude representing a logic level ONE (908). Pull-up transistors M5 144 and M6 146 are coupled to a gate of output transistor Q3 506 and Q4 508 respectively. The pull-up transistors are configured to set the voltage magnitude, $V_{OH}$, representing logic level ONE and configured to operate in a saturation region of the pull-up transistor.

In this manner, the techniques of this disclosure may use a more simplified bias circuit, e.g. bias circuits 114 and 600, when compared to other examples of SCL bias circuits. This is in part because the techniques of this disclosure may use a current mirror circuit comprising, for example, M5 144, M6 146 and M12 158 as pull-up transistors to set the logical HIGH voltage level $V_{OH}$ and voltage limiting devices, e.g. M13 102 and M14 104 limit the magnitude of voltage of voltage node V1 122 and V2 124 and set the logical LOW voltage level, $V_{OL}$, as described above in relation to FIG. 1.

Though this disclosure presents five variations on an improved SCL logic gate, each of the five variations are independent so that at least 32 variations may be possible by different arrangements of the variations. The variations include:
  Replace output MOS transistors with "super-Beta" bipolar transistors (aka DT MOSFETs) as depicted, for example in FIGS. 4 and 5.
  Replace a single voltage limiting "diode" with a series connected pair of "diodes" to further simplify the bias cell as depicted in FIG. 11.
  Replace the MOS current sinks with current sinks using "super-Beta" transistors, as depicted for example in FIG. 13.
  Replace the MOS current mirror pull-up transistors with "super-Beta" bipolar transistors, as depicted in FIG. 15.
  Replace the input "source-coupled" MOS transistors with "super-Beta" bipolar transistors, as depicted in FIG. 16.
In addition, the disclosure includes variations on how to implement the voltage limiting "diodes," such as diode connected transistors, Schottky diodes and other variations.

In some examples the variations of the improved SCL logic gates may include adjustments to the corresponding bias circuits. However, all of the bias circuit designs include the advantage of a simplified design strategy:
  (1) Set Vcs as a function of the bias current input.
  (2) Set the corresponding logic high voltage, $V_{ONE}$.
  (3) Set the corresponding logic low voltage, $V_{ZERO}$.
  (4) Set the Vgg voltage to a midpoint between the logic high voltage, $V_{ONE}$ and the logic low voltage, $V_{ZERO}$.
  (5) If necessary, buffer the Vcs, Vgg, $V_{ONE}$, and $V_{ZERO}$ voltages as appropriate.

Various examples of the disclosure have been described. These and other examples are within the scope of the following claims.

What is claimed is:

1. A logic gate circuit comprising:
  a first input terminal configured to receive an input logic level;
  a second input terminal configured to receive a logic threshold level;
  a first output voltage terminal;
  a first dynamic threshold (DT) metal oxide semiconductor field effect transistor (MOSFET) configured to drive the first output voltage terminal and cause the first output voltage terminal to output a buffered logic level of the input logic level;
  a second output voltage terminal;
  a second DT MOSFET configured to drive the second output voltage terminal and cause the second output voltage terminal to output an inverted logic level of the input logic level;
  a pull-up transistor configured to operate in a saturation region of the pull-up transistor and set a first voltage magnitude representing a logic level one for the logic gate circuit;
  a voltage limiting element coupled to a supply voltage and configured to set a second voltage magnitude representing a logic level zero for the logic gate circuit, wherein:
    in response to an input logic level greater than the logic threshold level, output the first voltage magnitude at the first output voltage terminal;
    in response to an input logic level less than the logic threshold level, output the second voltage magnitude at the first output voltage terminal.

2. The logic gate circuit of claim 1, wherein the logic gate circuit is configured to receive a bias voltage and wherein a magnitude of the bias voltage sets a performance level of the logic gate circuit.

3. The logic gate circuit of claim 2, wherein the performance level comprises one or more of: a toggle frequency, gate delay, propagation delay, an output rise time, an output fall time, a speed-power product, power consumption.

4. The logic gate circuit of claim 2, wherein the voltage limiting element is a first voltage limiting element, the logic gate circuit further comprising a bias circuit comprising:
  a third DT MOSFET configured to drive the logic threshold level; and
  a second voltage limiting element coupled to the gate of the third DT MOSFET, wherein a magnitude of current through the third DT MOSFET is based on the bias voltage.

5. The logic gate circuit of claim 4, wherein the bias circuit further comprises a buffer amplifier connected between the second voltage limiting element and the gate of the third DT MOSFET.

6. The logic gate circuit of claim 5, wherein the buffer amplifier is a first buffer amplifier, the bias circuit further comprising:
  one or more emitter-degeneration current sink circuits; and
  a second buffer amplifier coupled between an input terminal for the bias voltage and a respective base terminal for the one or more emitter-degeneration current sink circuits.

7. The logic gate circuit of claim 4, wherein the bias circuit further comprises a resistor divider connected between the voltage limiting element and the third DT MOSFET, wherein the resistor divider is configured to set a voltage magnitude of the logic threshold level.

8. The logic gate circuit of claim 4, wherein:
  the first voltage limiting element is implemented with first dimensions,
  the second voltage limiting element is implemented with second dimensions, and
  the first dimensions approximately match the second dimensions.

9. The logic gate circuit of claim 1, wherein the voltage limiting element comprises at least one of a diode-connected transistor, a PN junction diode, a Zener diode or a Schottky diode.

10. The logic gate circuit of claim 1, wherein the voltage limiting element comprises a first diode connected transistor connected in series with a second diode connected transistor.

11. The logic gate circuit of claim 1, wherein the pull up transistor is a first pull-up transistor coupled to a gate of the first DT MOSFET, the logic gate circuit further comprising a second pull-up transistor coupled to a gate of the second DT MOSFET, wherein:
the first pull-up transistor is arranged in a first leg of a current mirror,
the second pull-up transistor is arranged in a second leg of the current mirror,
the current mirror is configured to ensure a first magnitude of current through the first pull-up transistor approximately equals a second magnitude of current through the second pull-up transistor.

12. The logic gate circuit of claim 11, further comprising a current sink configured to carry at least first current from the first pull-up transistor during a first time and at least a second current from the second pull-up transistor during a second time different from the first time,
wherein a fall time of the first voltage magnitude is determined by a third current through the current sink, wherein the third current comprises at least the first current during the first time and the second current during the second time, and
wherein a rise time of the first voltage magnitude is based on the first current through the first pull-up transistor during the second time and the second current through the second pull-up transistor during the first time.

13. The logic gate circuit of claim 12, further comprising a current normalizing transistor configured to adjust a bias current through the current mirror based on channel length modulation in the current sink.

14. The logic gate circuit of claim 12, wherein the current sink comprises a source-degeneration current sink circuit.

15. The logic gate circuit of claim 12, wherein the current sink comprises an emitter-degeneration current sink circuit.

16. A system comprising:
a bias circuit comprising:
a first dynamic threshold (DT) metal oxide semiconductor field effect transistor (MOSFET) configured to drive a logic threshold level;
a first voltage limiting element coupled to the gate of the first DT MOSFET;
a current mirror circuit configured to receive a bias input, wherein a magnitude of current through the first DT MOSFET is based on the bias input; and
a plurality of logic gate circuits, wherein each respective logic gate circuit is configured to receive from the bias circuit:
the logic threshold level; and
the bias input; and
wherein each respective logic gate circuit comprises:
a first input terminal configured to receive an input logic level;
a first output voltage terminal;
a second dynamic threshold (DT) metal oxide semiconductor field effect transistor (MOSFET) configured to drive the first output voltage terminal and cause the first output voltage terminal to output a buffered logic level of the input logic level;
a second output voltage terminal;
a third DT MOSFET configured to drive the second output voltage terminal and cause the second output voltage terminal to output an inverted logic level of the input logic level;
a pull-up transistor configured to operate in a saturation region of the pull-up transistor and set a first voltage magnitude representing a logic level one for the logic gate circuit;
a voltage limiting element coupled to a supply voltage and configured to set a second voltage magnitude representing a logic level zero for the logic gate circuit.

17. The system of claim 16, wherein a magnitude of the bias input sets a performance level of the plurality of logic gate circuits, wherein the performance level comprises one or more of: a toggle frequency, gate delay, propagation delay, an output rise time, an output fall time, a speed-power product, power consumption.

18. The system of claim 16, wherein the voltage limiting element comprises at least one of a diode-connected transistor, a PN junction diode, a Zener diode or a Schottky diode.

19. A method comprising:
receiving, by a logic gate circuit, a bias input,
wherein a magnitude of the bias input sets a performance level of the of logic gate circuit, and
wherein the bias input is one of a bias voltage or a bias current;
receiving, by the logic gate circuit, a logic threshold level;
receiving, by the logic gate circuit an input logic level;
in response to the input logic level being less than the logic threshold level, outputting, by a dynamic threshold (DT) metal oxide semiconductor field effect transistor (MOSFET) of the logic gate circuit, a first voltage magnitude representing a logic level zero;
receiving, by the logic gate circuit a second input logic level
in response to the input logic level being greater than the logic threshold level, outputting, by the DT MOSFET of the logic gate circuit, a second voltage magnitude representing a logic level one, wherein:
a pull-up transistor is coupled to a gate of the DT MOSFET, and wherein the pull-up transistor configured to set the first voltage magnitude representing the logic level one and configured to operate in a saturation region of the pull-up transistor, and
a voltage limiting element is coupled between a supply voltage and the gate of the DT MOSFET, wherein the voltage limiting element is configured to set the second voltage magnitude representing the logic level zero.

20. The method of claim 19, wherein the voltage limiting element comprises a diode-connected transistor.

* * * * *